(12) United States Patent
Mori

(10) Patent No.: US 7,007,265 B2
(45) Date of Patent: Feb. 28, 2006

(54) METHOD FOR GENERATING MASK DATA, MASKS, RECORDING MEDIA, AND METHOD FOR MANUFACTURING SEMICONDUCTOR DEVICES

(75) Inventor: Katsumi Mori, Sakata (JP)

(73) Assignee: Seiko Epson Corporation, (JP)

( * ) Notice: Subject to any disclaimer, the term of this patent is extended or adjusted under 35 U.S.C. 154(b) by 175 days.

(21) Appl. No.: 10/236,457

(22) Filed: Sep. 6, 2002

(65) Prior Publication Data

US 2003/0051225 A1    Mar. 13, 2003

(30) Foreign Application Priority Data

Sep. 7, 2001 (JP) ............................. 2001-272233

(51) Int. Cl.
  *G06F 17/50* (2006.01)
(52) U.S. Cl. ............................. 716/19; 716/20; 716/21
(58) Field of Classification Search ................. 716/19, 716/20, 15; 257/776–780; 438/624, 631, 438/6
See application file for complete search history.

(56) References Cited

U.S. PATENT DOCUMENTS

| | | | |
|---|---|---|---|
| 4,916,514 A | | 4/1990 | Nowak |
| 5,119,164 A | * | 6/1992 | Sliwa et al. ................. 257/776 |
| 5,192,715 A | * | 3/1993 | Sliwa et al. ................. 438/631 |
| 5,556,805 A | | 9/1996 | Tanizawa et al. |
| 5,597,668 A | | 1/1997 | Nowak et al. |
| 5,790,417 A | | 8/1998 | Chao et al. |
| 5,798,298 A | | 8/1998 | Yang et al. |
| 5,801,082 A | * | 9/1998 | Tseng ........................... 438/424 |
| 5,885,856 A | | 3/1999 | Gilbert et al. |
| 5,902,752 A | | 5/1999 | Sun et al. |
| 5,998,522 A | * | 12/1999 | Nakano et al. ............. 524/315 |
| 6,395,629 B1 | * | 5/2002 | Sidhwa et al. .............. 438/643 |
| 6,566,156 B1 | * | 5/2003 | Sturm et al. .................. 438/35 |
| 6,608,389 B1 | * | 8/2003 | Hashimoto .................. 257/784 |
| 6,730,617 B1 | * | 5/2004 | Carter ......................... 438/780 |
| 2001/0039647 A1 | | 11/2001 | Mori et al. |
| 2001/0042921 A1 | | 11/2001 | Mori et al. |
| 2003/0042611 A1 | * | 3/2003 | Mori .......................... 257/758 |

FOREIGN PATENT DOCUMENTS

| | | |
|---|---|---|
| JP | 04218918 A | 8/1992 |
| JP | 09107028 A | 4/1997 |
| JP | 09-153550 | 6/1997 |
| JP | 09181159 A | 7/1997 |
| JP | 10092921 A | 4/1998 |
| JP | 10335333 A | 12/1998 |
| JP | 11026576 A | 1/1999 |
| JP | 2001-267322 | 9/2001 |
| JP | 2001-267415 | 9/2001 |

* cited by examiner

*Primary Examiner*—Matthew Smith
*Assistant Examiner*—Binh Tat
(74) *Attorney, Agent, or Firm*—Harness, Dickey & Pierce, P.L.C.

(57) ABSTRACT

A method for generating mask data that is used for a method of manufacturing semiconductor devices is provided. The semiconductor device includes wiring layers disposed in a specified pattern on a base and stress relieving layers disposed in a specified pattern over the base. The method for generating mask data comprises a step of forming resized patterns 130 by resizing wiring layer patterns 120 with a positive (+) resizing amount, a step of deleting, among the resized patterns 130, resized patterns having portions that mutually overlap, and a step of forming stress relieving layer patterns having a specified width outside the resized patterns.

20 Claims, 21 Drawing Sheets

METHOD FOR GENERATING MASK DATA, MASKS, RECORDING MEDIA, AND METHOD FOR MANUFACTURING SEMICONDUCTOR DEVICES

BACKGROUND OF THE INVENTION

1. Technical Field of the Invention

The present invention relates to methods for generating mask data, masks, recording media, and methods for manufacturing semiconductor devices, and more particularly to methods for generating mask data, masks, recording media, and methods for manufacturing semiconductor devices, which are used for manufacturing semiconductor devices having an interlayer dielectric layer in which the dielectric layer is well embedded between wiring layers even when the gap between the wiring layers is particularly narrow.

2. Background Technology and Problems to be Solved by the Invention

In semiconductor devices such as LSIs, the width of wiring layers has become small and the gap between the wiring layers has also become narrow due to further device miniaturization, higher densification, greater number of multiple layers. For example, in the 0.13 μm generation design rule, the minimum line width of a metal wiring layer is 0.2 μm, and the minimum gap is 0.22 μm. When silicon oxide is embedded by a CVD method in such a narrow gap between the wiring layers, voids may be generated in the embedded silicon oxide layer because the gap between the wiring layers is too narrow, resulting in an embedding failure.

Coated silicon oxide called SOG (Spin On Glass) is provided by spin-coating a wafer with a dielectric film material dissolved in an organic solvent, and then hardening the layer by a heat treatment. Such a SOG layer is excellent in its embedding property due to its high flowability. However, when the SOG layer is subject to a heat treatment for thermosetting, which is called "curing", the SOG layer shrinks as the organic solvent evaporates.

The inventors of the present invention have confirmed that, when a SOG layer is used as an interlayer dielectric layer between wiring layers that are formed according to, for example, the 0.13 μm generation design rule, a shrinkage occurs in the SOG layer, and causes a compression force against the wiring layers in their thickness direction, which would likely deform metal wiring layers such as aluminum layers in particular. When wiring layers are deformed, the wiring reliability and migration resistivity may lower. In addition, deformations in wiring layers would occur particularly in wiring layers having patterns that are isolated from others.

It is an object of the present invention to provide methods for generating mask data, masks, recording media, and methods for manufacturing semiconductor devices, which are used for manufacturing semiconductor devices having an interlayer dielectric layer with an excellent embedding property for gaps between adjacent wiring layers even when they are formed in accordance with, for example, a sub 0.13 μm generation design rule.

SUMMARY OF THE INVENTION

The present invention pertains to a method for generating mask data that is used for a method of manufacturing semiconductor devices, the semiconductor device including wiring layers disposed in a specified pattern on a base and stress relieving layers disposed in a specified pattern over the base, the method comprising:

a step of forming resized patterns by resizing wiring layer patterns with a positive (+) resizing amount;

a step of deleting, among the resized patterns, resized patterns having portions that mutually overlap; and a step of forming stress relieving layer patterns having a specified width outside the resized patterns.

The method for generating mask data in accordance with the present invention may have the following embodiments.

(a) In the step of forming the resized patterns, the resizing amount may correspond to a minimum gap between the wiring layers in a used design rule.

(b) The stress relieving layer patterns may have a width that corresponds to a minimum line width of the wiring layers in a used design rule.

(c) The stress relieving layer pattern may further include a portion having a greater width than a width corresponding to the minimum line width of the wiring layers in the used design rule.

(d) The step of forming the stress relieving layer pattern may comprise:

a step of forming, outside the resized patterns, first intermediate patterns having a width corresponding to the minimum line width in the used design rule;

a step of forming second intermediate patterns by positively resizing the first intermediate patterns with a resizing amount of width corresponding to ½ of the minimum gap of the wiring layers in the used design rule;

a step of negatively resizing the second intermediate patterns with a resizing amount of width corresponding to ½ of the minimum gap of the wiring layers in the used design rule; and a step of leaving mutually overlapping portions among the second intermediate patterns as one pattern.

(e) The stress relieving layer patterns may be continuous along the wiring layer patterns.

(f) The stress relieving layer patterns may be disposed at least in a region that corresponds to a rough pattern region of the wiring layers. In the semiconductor device, wiring layers in a rough pattern region would more likely be affected by a compression force caused by a planarization dielectric layer compared to those in a dense pattern region, and therefore the necessity to provide a stress relieving dielectric layer in the rough pattern region is high. Here, the "dense pattern region" means a region with a high wiring density in which wiring layers are disposed, for example, at the minimum gaps according to an applied design rule. Also, the "rough pattern region" means, for example, a region in which wiring layers present are isolated from other wiring layers or a region with a lower wiring density than that of the dense pattern region. Also, the "design rule" in accordance with the present invention means a variety of design rules stipulated in the ITRS (International Technology Roadmap for Semiconductor) 2000.

(g) Data for a dummy generation region may be added to data for the stress relieving layer patterns. In other words, data for the stress relieving layer patterns and dummy patterns can be set in one mask data. Furthermore, data for the wiring layer patterns can be added to data for the stress relieving layer patterns and the dummy patterns. In other words, data for the stress relieving layer patterns, dummy patterns and wiring layer patterns can be set in one mask data.

A mask in accordance with the present invention can be fabricated by the mask data obtained by its generating method in accordance with the present invention. Also, a computer readable recording medium in accordance with the present invention records mask data obtained by the method for generating mask data in accordance with the present invention.

A method for manufacturing a semiconductor device pertains to a method for manufacturing a semiconductor device including wiring layers disposed on a base and an interlayer dielectric layer that covers the wiring layers, the method comprising:

a step of forming at least stress relieving layers in a specified pattern on the base, using a mask as recited above;

a step of forming a planarization dielectric layer from a liquid dielectric material in a manner to cover the stress relieving layers and the wiring layers.

The step of forming the planarization dielectric layer may be conducted by a coating method or a liquid CVD method.

The step of forming the planarization dielectric layer may include the steps of depositing a dielectric layer by a CVD method to cover the wiring layers over the base, and then patterning the dielectric layer. Furthermore, the stress relieving layers and the wiring layers can be patterned together with the dummy layers at the same time.

The step of forming the stress relieving layers may include the step of patterning the stress relieving layers and the wiring layers at the same time. Furthermore, the dummy layers can be patterned with the stress relieving layers at the same time.

The step of forming the interlayer dielectric layer may further include the step of forming a base dielectric layer at least on the wiring layers and the stress relieving layers, and the step of forming a cap dielectric layer on the planarization dielectric layer.

The semiconductor device obtained by the manufacturing method in accordance with the present invention comprises stress relieving layers having a specified pattern. As a result, even when a planarization dielectric layer that is embedded in gaps between the wiring layers causes a compression force that works on the wiring layers, the compression force is absorbed by the stress relieving layer. As a result, the compression force that works on the wiring layers can be diminished relatively, and deformations of the wiring layers by the compression force can be prevented. The stress relieving dielectric layer may be disposed in such a manner mainly to relieve compression forces that may be applied to the wiring layers due to the planarization dielectric layer. The method for generating mask data, masks, recoding media, and method for manufacturing semiconductor devices in accordance with the present invention are preferably applied to formation of layers in which metal wiring layers that are apt to deform by compression forces are formed.

DETAILED DESCRIPTION OF THE PREFERRED EMBODIMENTS OF THE PRESENT INVENTION

One embodiment example of the present invention will be described below with reference to the accompanying drawings.

[Device]

Figure 1:
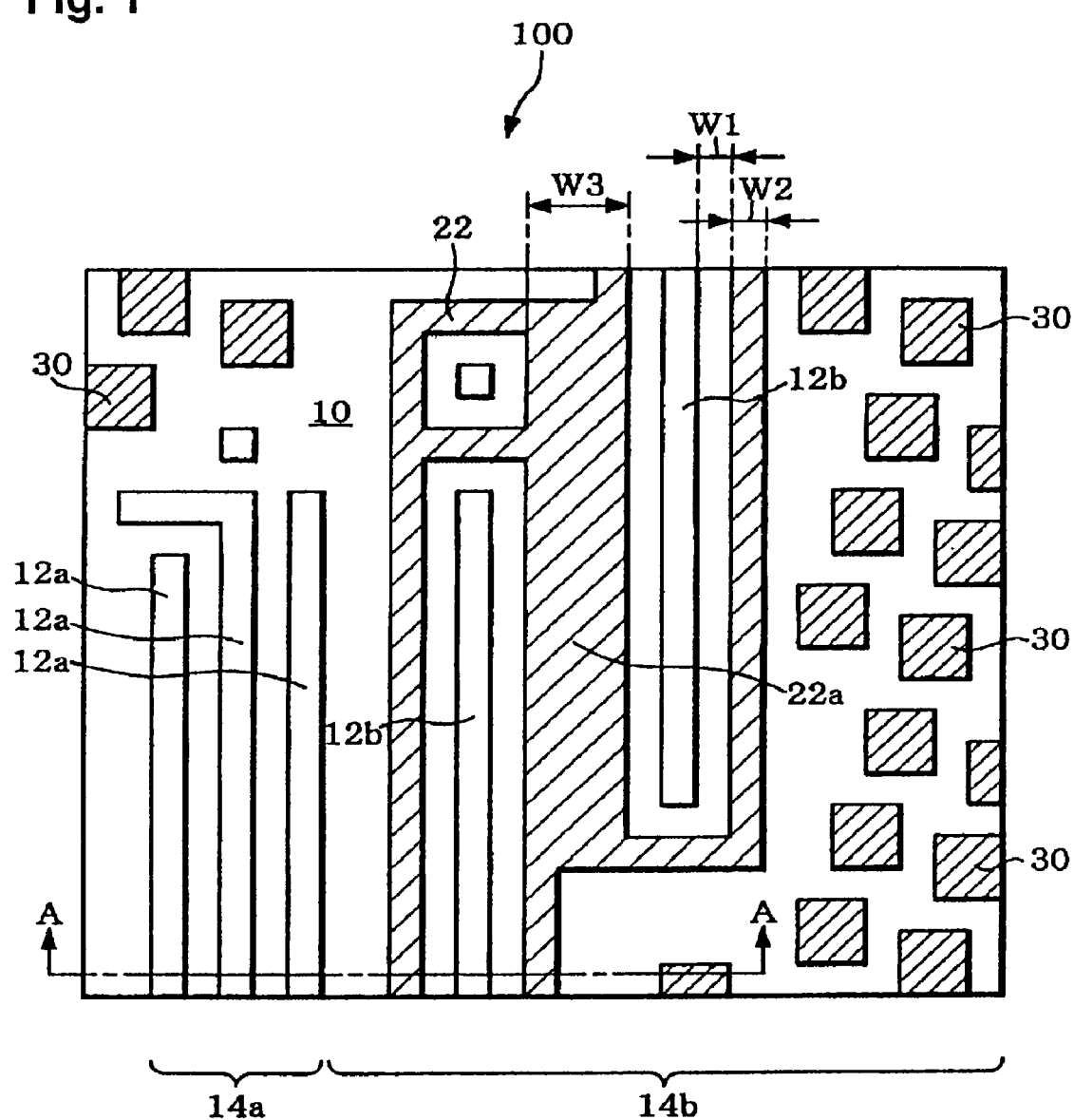
FIG. 1 schematically shows a plan view of a semiconductor device obtained by a method for manufacturing a semiconductor device in accordance with a first embodiment of the present invention.

First, a description is made as to a semiconductor device that is manufactured by using masks obtained by a method for generating mask data in accordance with the present embodiment. FIG. 1 schematically shows a plan view in part of a base where wiring layers of a semiconductor device 100 are formed, and FIG. 2 shows a cross-sectional view taken along a line A—A of FIG. 1.

The semiconductor device 100 includes wiring layers 12 (12a, 12b), stress relieving layers 22 composed of dielectric material, and an interlayer dielectric layer 20 that is formed in a manner to cover the wiring layers 12 and stress relieving layers 22, which are formed on the base 10. Here, the "base" indicates a structural body below specified wiring layers and the interlayer dielectric layer 20 that covers the wiring layers. For example, when the interlayer dielectric layer 20 is an interlayer dielectric layer in the second layer, the base 10 may be formed, although not shown, from a semiconductor substrate, and an element isolation region, a semiconductor element such as a MOSFET and wiring layers formed on the semiconductor substrate, and an interlayer dielectric layer in the first layer. The layers in which the method for manufacturing semiconductor devices of the present invention is applied may be layers at any locations; but in particular, they may preferably be metal wiring layers and an interlayer dielectric layer for covering the metal wiring layer.

Figure 2:
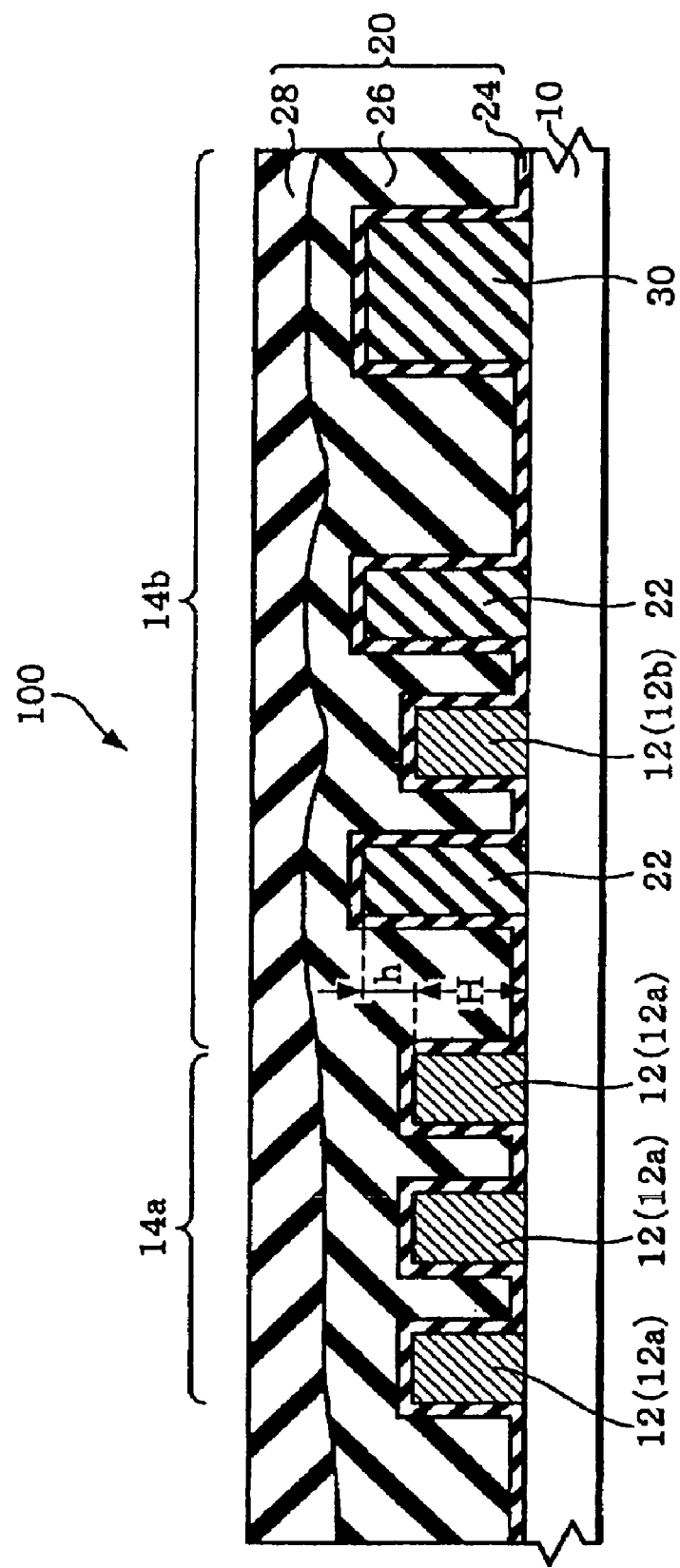
FIG. 2 shows a cross-sectional view of the semiconductor device taken along a line A—A shown in FIG. 1.

The example in FIG. 1 and FIG. 2 shows wiring layers 12a in a dense pattern region 14a and a wiring layer 12b in a rough or sparse pattern region 14b. The wiring layers 12 (12a and 12b) may be formed from metal material mainly selected, for example, from aluminum, aluminum alloy, copper or copper alloy.

The stress relieving layers 22 having a specified pattern are disposed on the base 10. The pattern of the stress relieving layers 22 is not limited to a particular pattern, and may be, for example, continuous as indicated in FIG. 1, or may be composed of blocks of layers disposed in a discontinuous manner. Preferably, the stress relieving layers 22 may continuously extend at least in a direction in which the wiring layers 12 extend (in a length direction) as indicated in FIG. 1, in view of the function of relieving stresses. By disposing the stress relieving layers 22 in such a manner, stresses can be uniformly absorbed.

The stress relieving layers 22 are formed at least in the rough pattern region 14b. More specifically, forming regions, patterns and density of the stress relieving layers 22 are set such that the impact of compression forces of a planarization dielectric layer 26 that works on the wiring layers 12 can be suppressed, and deformations of the wiring layers 12 can be prevented. Also, the stress relieving layers 22 may be formed with the minimum gap and minimum line width for wiring layers according to the applied design rule. More specifically, when a gap between adjacent stress relieving layer 22 and wiring layer 12 is W1, and a width of the stress relieving layer 22 is W2, W1 can be set at the minimum gap and W2 can be set as the minimum line width for wiring layers. For example, according to the 0.13 μm generation design rule, the minimum line width of metal wiring layers is 0.20 μm, and the minimum gap is 0.22 μm. By forming the stress relieving layers 22 according to such a rule, the stress relieving layers with miniature patterns can be formed, which can suppress the impact of compression forces of the planarization dielectric layer 26 that may act on the wiring layers 12 to a minimum level.

Also, in the present embodiment, as shown in FIG. 1, the stress relieving layer 22 can partially have a width W3 that is greater than the minimum line width W2 of the wiring layers. In this example, the width W3 of a portion 22a is the sum of (two times the minimum line width W2) and the minimum gap W1. The width W3 will be described in detail in a section below concerning mask data.

The stress relieving layer 22 may preferably be more dense and have a greater mechanical strength than the planarization dielectric layer 26, and may be composed of a silicon oxide layer that is formed by, for example, a CVD method. More specifically, the stress relieving layer 22 may be composed of a silicon oxide layer that can be obtained by a CVD method, such as, for example, a $SiH_4$—$O_2$ group normal pressure CVD, $SiH_4$—$N_2O$ group CVD, TEOS—$O_2$ group plasma CVD, $SiH_4$—$O_2$ group high-density plasma CVD or the like. Kinds of gases that are used for each of the CVD methods are not limited to those mentioned above, but can be any of various kinds of gases. Further, fluoride gas may be introduced into the gases to improve the embedding property.

Furthermore, the stress relieving layers 22 may preferably have a height that is the same as or greater than the height H of the wiring layers 12, as shown in FIG. 2. When the height of the stress relieving layers 22 is greater than that of the wiring layers 12, compression forces of the planarization dielectric layer 26 preferentially act on the stress relieving layers 22, such that the impact of the compression forces caused by the planarization dielectric layer 26 on the wiring layers 12 can be further diminished. More specifically, a protrusion height of the stress relieving layers 22 (i.e., a height h from an upper surface of the wiring layers 12 to an upper surface of the stress relieving layers 22) may be set at $0 \leq h \leq H/2$, when the wiring layers 12 has a height H, in view of relieving the compression forces of the planarization dielectric layer 26 described above. When the protrusion height of the stress relieving layers exceeds a value of H/2, the space between the wiring layers 12 and the stress relieving layers 22, or an aspect ratio of a space between one stress relieving layer 22 and an adjacent stress relieving layer 22 becomes large, which may cause the planarization dielectric layer 26 to present an insufficient embedding property.

Also, the stress relieving layers 22 can have a function of dummy patterns that prevent a polishing failure called dishing in a CMP process as well as the above-described function to relieve compression forces of the planarization dielectric layer 26.

Depending on the requirements, the semiconductor device 100 may include dummy patterns 30, which have a pattern different from the pattern of the stress relieving layers 22, as shown in FIGS. 1 and 2. In this case, the dummy patterns 30 may be dielectric layers formed from the same material as that of the stress relieving layers 22, or may be formed from the same material as that of the wiring layers 12. In the case of the example shown in the figures, in view of short-circuit or wiring capacitance of the wiring layers, the dummy patterns 30 are formed from dielectric layers made of the same material as that of the stress relieving layers 22. In the example shown in the figure, the dummy patterns 30 include plane patterns each having a greater width than that of the stress relieving layers 22, and are regularly disposed.

Stress relieving layers in accordance with the present invention differ in the following aspects from so-called dummy patterns that are formed to improve planarization in a CPM process. Since dummy patterns are formed to improve the degree of flatness of the entire surface of a substrate, or to improve the uniformity in polishing the entire surface in a CMP process, such dummy patterns are disposed regularly across the entire surface of a wafer. In contrast, stress relieving dielectric layers in accordance with the present invention can be provided in any specific area to achieve the stress relieving function described above, and may not be disposed regularly across the entire surface of a wafer.

The interlayer dielectric layer 20 is formed in a manner to cover the wiring layers 12, the stress relieving layers 22 and the dummy layers 30. The interlayer dielectric layer 20 includes a base dielectric layer 24, a planarization dielectric layer 26 and a cap dielectric layer 28.

The base dielectric layer 24 is a layer that is formed to avoid direct contacts between the wiring layers 12 and the planarization dielectric layer 26. The planarization dielectric layer 26 to be described later in detail generally has a porous structure and high moisture absorbability. Therefore, when the planarization dielectric layer 26 directly contacts the wiring layers, the wiring layers may be corroded, or cracks may be generated in the interlayer dielectric layer as the layer itself is weak. To avoid such problems, normally, the base dielectric layer 24 can be formed by a silicon oxide layer that is dense and has a great mechanical strength. Such a silicon oxide layer can be obtained by a CVD method such as a normal pressure CVD, plasma CVD, or high-density plasma CVD, like the stress relieving dielectric layers 22. Also, the base dielectric layer 24 has a thickness that can provide the functions described above, for example, 10–50 nm.

The planarization dielectric layer 26 is formed from a liquid dielectric material having an excellent step covering property. More specifically, the planarization dielectric layer 26 can be composed of a silicon oxide layer or another dielectric layer having a low dielectric constant that is obtained by a coating method or a liquid CVD. Here, the "dielectric layer having a low dielectric constant" is a layer typically having a relative dielectric constant of 3.0 or lower.

The silicon oxide layer formed from liquid dielectric material may be generally grouped into SOG that is obtained by a coating method and silicon oxide that is obtained by a liquid CVD. The material of the planarization dielectric layer 26 may be either SOG or silicon oxide that is formed by a liquid CVD method, and may preferably be SOG because it can be formed with a relatively simple facility and therefore is highly economical.

Silicon oxide formed by the SOG or liquid CVD method may not be particularly limited, and may be any one of those ordinarily used.

The SOG may be formed by spin-coating dielectric material that is dissolved in an organic solvent on a wafer, and then conducting a heat treatment after the coating step. A typical heat treatment is composed of heat treatment for removing the solvent, which is called "baking", and heat treatment for thermosetting, which is called "curing". The SOG is generally grouped into organic SOG and inorganic SOG. The inorganic SOG includes silicate groups, alkoxy silicate groups, and polysilazane groups.

In the liquid CVD, a liquid reaction intermediate is deposited on the base, and then the reaction intermediate is changed to a complete oxide film by a heat treatment or the like. The methods listed below are known as the type of liquid CVD method described above:

(a) Thermal CVD with TEOS and $O_3$ (Temperature: about 400° C.)

(b) Plasma reaction with Si $(CH_3)_4$ and $O_2$ (Substrate temperature: from –20° C. to –40° C.)

(c) Plasma reaction with TEOS and $H_2O$ (Substrate temperature: from 60° C. to 120° C.)

(d) Plasma reaction with $SiH_4$ and $O_2$ (Substrate temperature: –80° C. or lower)

(e) Heat treatment reaction with $SiH_4$ and $H_2O_2$ (Substrate temperature: about 0° C.) under reduced pressure.

As to the planarization dielectric layer 26 that is formed from a liquid dielectric material, the layer is formed on the base in a liquid state in the SOG process, and in a state of liquid reaction intermediate in the liquid CVD, and thus the layer has an excellent step covering property. As a result, a dielectric layer having a good embedding property can be formed without generating voids even in gaps between the wiring layers 12a and 12a in the dense pattern region 14a where the layers are disposed with the minimum gap according to, for example, a sub 0.13 μm generation design rule. Also, a dielectric layer having an excellent embedding property can be formed not only in the gaps between the wiring layers 12, but also gaps between the wiring layers 12 and the stress relieving layers 22, and gaps between the adjacent stress relieving layers 22.

The cap dielectric layer 28 is formed in contact with the planarization dielectric layer 26 for the same reasons described above in conjunction with the base dielectric layer 24. When the interlayer dielectric layer 20 is planarized by a CMP process, the cap dielectric layer 28 is formed with a film thickness that takes into account a thickness to be polished by the CMP. Also, the same film growth method and material for the base dielectric layer 24 may be used for the cap dielectric layer 28.

With the semiconductor device obtained by the manufacturing method in accordance with the present invention, the following effects are achieved.

The semiconductor device 100 includes the stress relieving layers 22 having a specified pattern between the wiring layers 12, in particular, in the rough pattern region 14b. For this reason, even when compression forces caused by the planarization dielectric layer 26 that is embedded between the wiring layers 12 work on the wiring layers 12, the compression forces are absorbed by the stress relieving layer 22. As a result, the compression forces that may work on the wiring layers 12 can be relatively diminished, and deformations of the wiring layers 12 by the compression forces can be prevented. For example, when wiring layers are formed according to a sub 0.13 μm generation design rule, and a minimum gap between the wirings is 0.18–0.22 μm, compression forces caused by the planarization dielectric layer 26 would not deform or crush the wiring layers.

In the semiconductor device 100, the stress relieving layers 22 that are disposed between the wiring layers 12 are formed from dielectric layers such as silicon oxide layers, such that problems such as short-circuit would not occur even when they are placed between the wiring layers 12 disposed at narrow pitches. Also, as the stress relieving layers 22 are not composed of conductive material such as metal, they would not increase the wiring capacitance, and therefore would have practically no contribution to the transmission delay of electrical signals.

With the semiconductor device 100, even when the planarization dielectric layer 26 that is difficult to attain a large mechanical strength is used, the stress relieving layers 22, which are present with a certain density among the planarization dielectric layer 26, absorb its shrinking force (i.e., a compression force against the wiring layers 12 and the stress relieving dielectric layers 22), such that cracks are not generated in the planarization dielectric layer 26.

Also, the stress relieving layers 22 can function as dummy patterns that prevent a polishing defect which is called dishing in a CMP process.

[Method For Generating Mask Data]

One example of a method for generating mask data, which is used to form the stress relieving layers 22 on the base 10, is described below with reference to FIGS. 6–14. The mask data can be generated by using a computer. In the present embodiment, a method for generating mask data that is employed in the method for manufacturing the semiconductor device 100 shown in FIGS. 1 and 2 is described. In the present embodiment, a description is made as to one example of a method for generating mask data that is used for patterning the stress relieving layers 22 and dummy layers 30 indicated with cross-hatching in FIG. 1.

(1) Creation of First and Second Mask Data (Mask Data For Resized Pattern)

Figure 6:
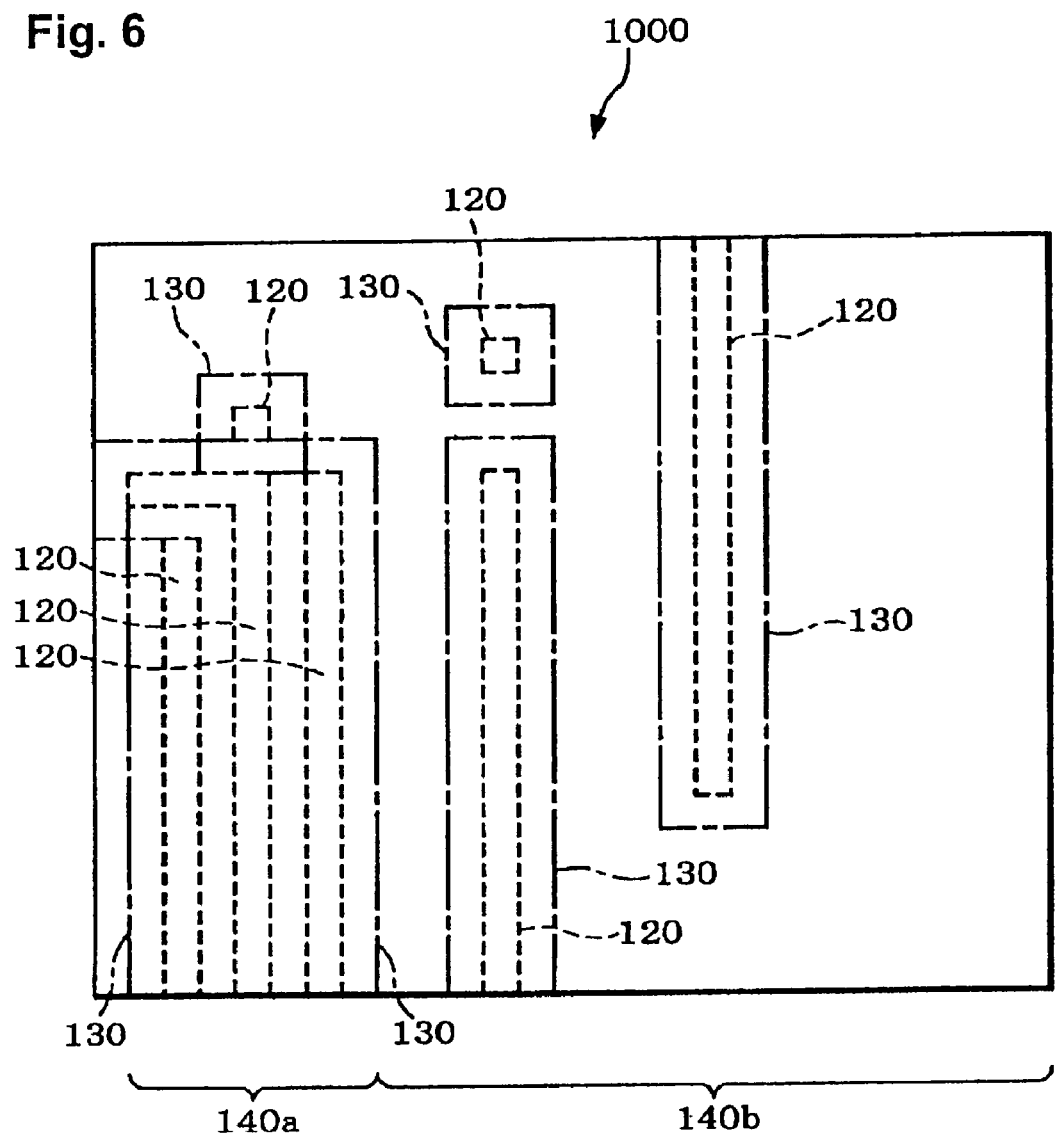
FIG. 6 shows first mask data in accordance with the first embodiment of the present invention.

A first mask data 1000 shown in FIG. 6 is created. In the first mask data 1000, resized patterns 130, which are resized wiring layer patterns 120 that correspond to wiring layers 12, are set. More specifically, the resized patterns 130 are set by resizing the wiring layer patterns 120 with a positive (+) resizing amount. Here, "resizing" means to modify a specified pattern in a similar configuration. In other words, to resize with a positive (+) resizing amount means to enlarge each of the sides of a specified pattern by the same resizing amount in a direction perpendicular to each of the sides. In the present embodiment, the resizing amount corresponds to a space width between a wiring layer 12 and a stress relieving layer 22; for example, it can have a size that corresponds to a minimum gap between wiring layers in the used design rule.

Figure 7:
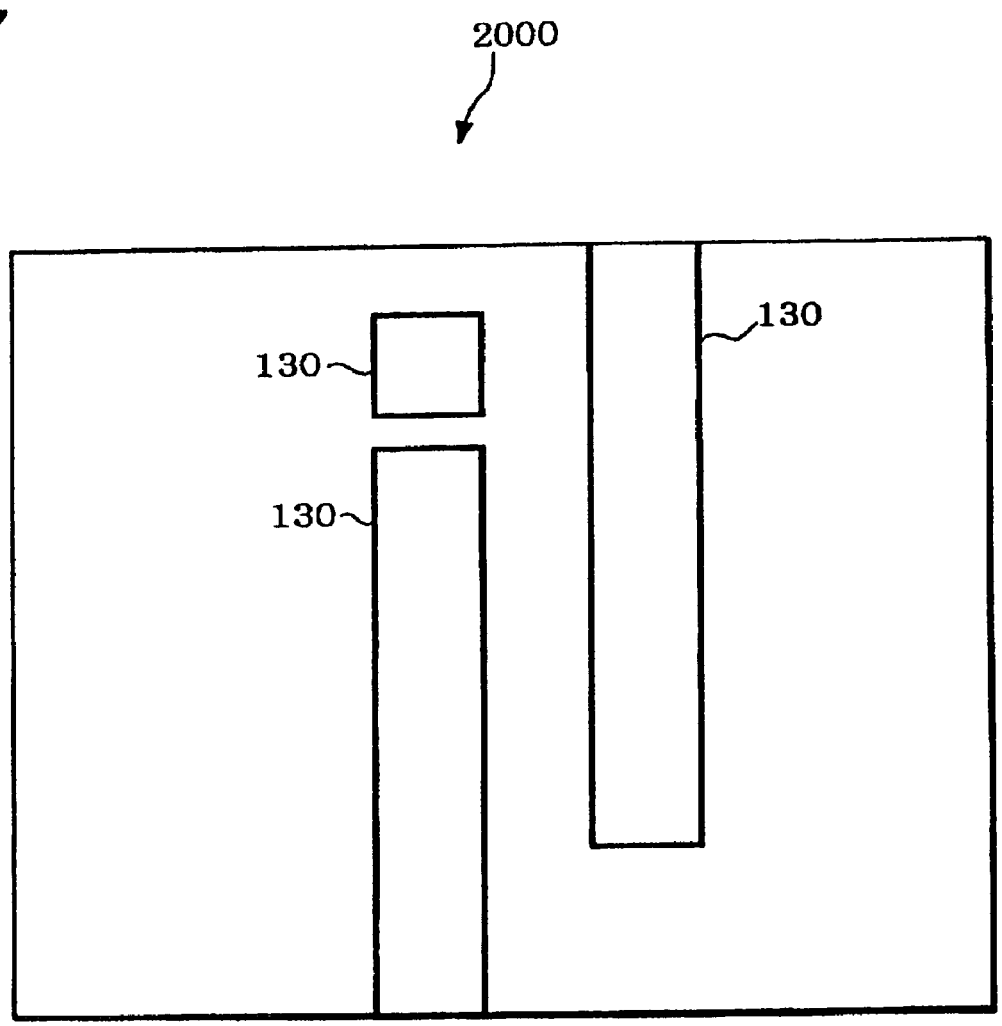
FIG. 7 shows second mask data in accordance with the first embodiment of the present invention.

Then, among the resized patterns 130, those resized patterns 130 that overlap one another are deleted. In the example shown in the figure, in a region 140*a* that corresponds to the dense pattern region 14*a* of the semiconductor device shown in FIGS. 1 and 2, since the resized patterns 130 for the adjacent wiring layer patterns 120 partially overlap one another, those resized patterns 130 are eliminated. In contrast, in a region 140*b* that corresponds to the rough pattern region 14*b* of the semiconductor device shown in FIGS. 1 and 2, the adjacent resized patterns 130 do not overlap one another, and therefore are left as mask data. A second mask data 2000 that defines the resized patterns 130 thus formed is shown in FIG. 7.

(2) Creation Of Third Mask Data (Mask Data For Stress Relieving Layer Patterns)

Figure 10:
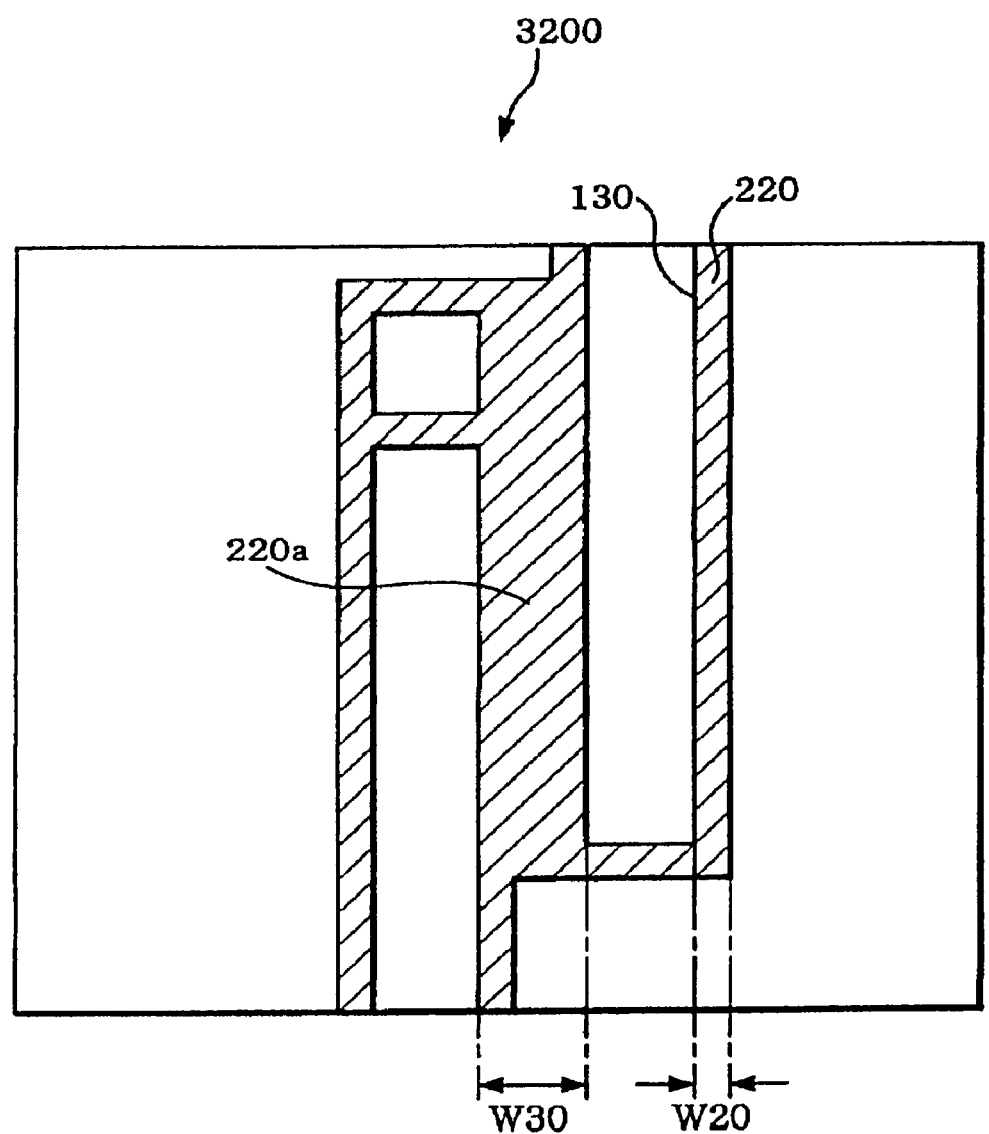
FIG. 10 shows the third mask data in accordance with the first embodiment of the present invention.

Next, third mask data 3200 shown in FIG. 10 is created. In the third mask data 3200, a stress relieving layer pattern 220 that corresponds to the stress relieving layer 22 is set. The stress relieving layer pattern 220 is formed outside the resized patterns 130 that are set in the second mask data 2000, and has a specified width. The width of the stress relieving layer pattern 220 corresponds to the width of the stress relieving layer 22; for example, it can have a size that corresponds to the minimum line width of wiring layers in the used design rule.

Figure 8:
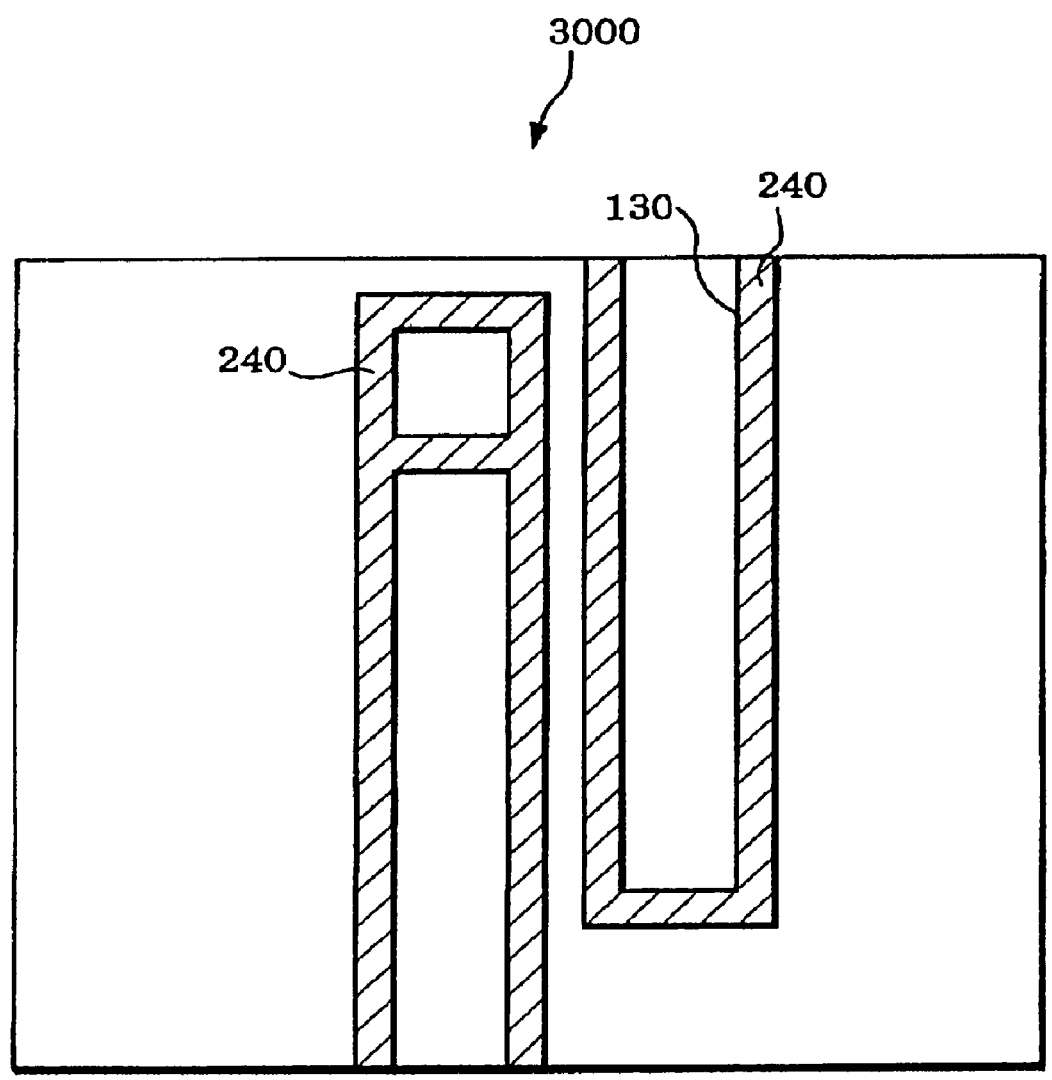
FIG. 8 shows first intermediate mask data for generating a third mask data in accordance with the first embodiment of the present invention.
Figure 9:
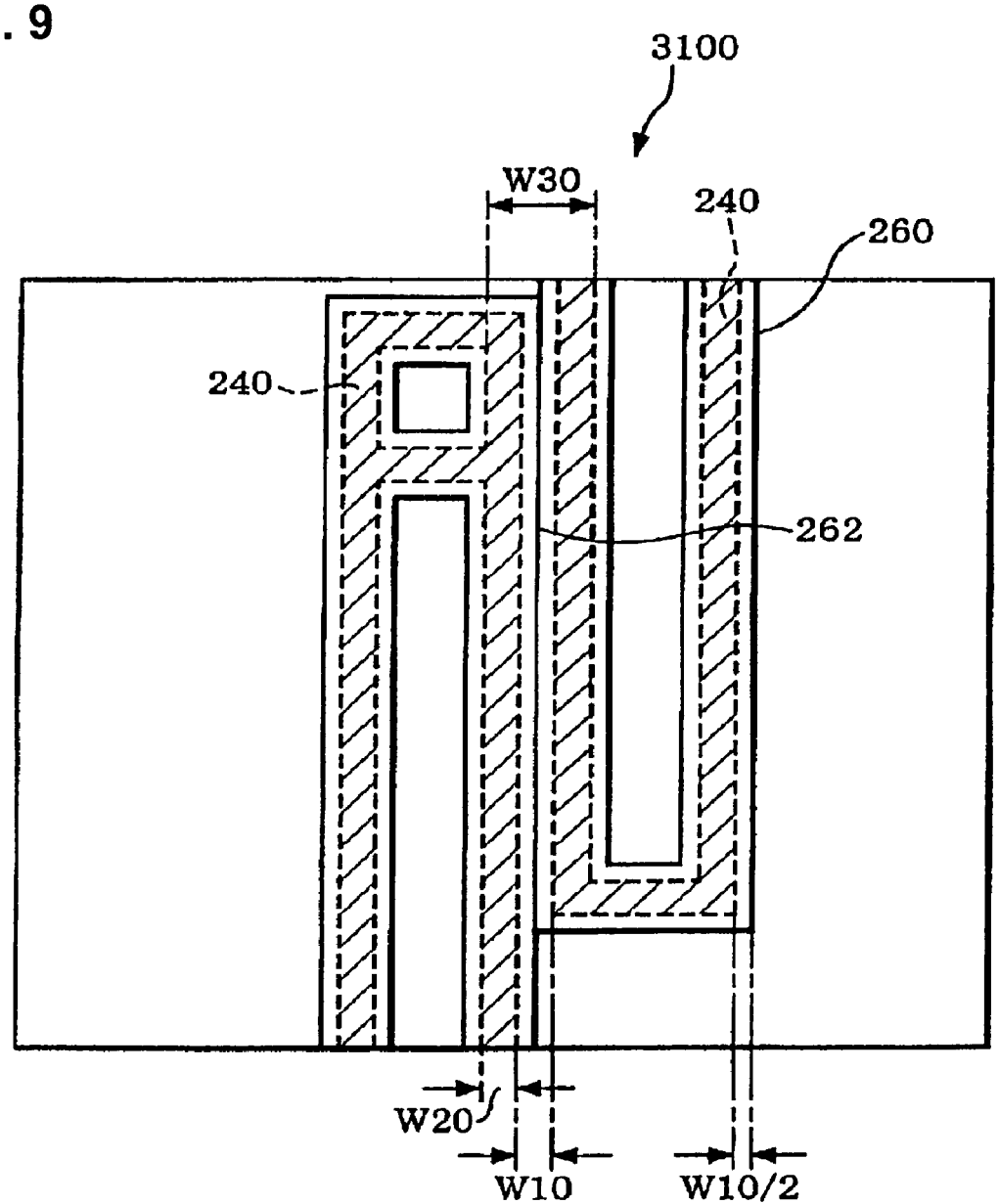
FIG. 9 shows second intermediate mask data for generating the third mask data in accordance with the first embodiment of the present invention.

In the present embodiment, the stress relieving layer pattern 220 can have in part a portion 220*a* having a width greater than the size corresponding to the minimum line width of wiring layer. Referring to FIGS. 8–10, a method for creating the stress relieving layer pattern 220 will be described below.

First, as shown in FIG. 8, first intermediate mask data 3000 is created. In the first intermediate mask data 3000, first intermediate patterns 240 are set. The first intermediate patterns 240 are formed outside the resized patterns 130 that are set in the second mask data 2000, and have a specified width. In the example shown in the figure, the specified width has a size corresponding to the minimum line width of wiring layers in the used design rule.

Next, as shown in FIG. 9, second intermediate mask data 3100 is created. In the second intermediate mask data 3100, second intermediate patterns 260 are set. The second intermediate patterns 260 are formed by resizing the first intermediate patterns 240 with a positive resizing amount. In the case of this example, the resizing amount corresponds to a width that is ½ of the minimum gap of wiring layers in the used design rule (i.e., a width corresponding to W10/2, where W10 is the width corresponding to the minimum gap). Then, while leaving patterns of mutually overlapping portions (portions indicated by reference number 262 in FIG. 9), the second intermediate patterns 260 are formed into a unitary pattern. Then, the second intermediate patterns 260 are negatively resized with a sizing amount that is ½ of the width W10 that corresponds to the minimum gap of wiring layers in the used design rule. In this manner, the stress relieving layer pattern 200 shown in FIG. 10 is formed by means of the first and second intermediate mask data 3000 and 3100.

More specifically, as shown in FIG. 10, in the region where the first intermediate patterns 240 are disposed with a gap of the width W10 of less that corresponds to the minimum gap, the portions 220*a* having a width W30 greater than the width W10 corresponding to the minimum gap are formed. In this example, the width W30 is the sum of (two times the width W20 corresponding to the minimum line width (W20×2)) and the width W10 corresponding to the minimum gap. Also, in the region where the first intermediate patterns 240 are disposed with a gap greater that the width W10 that corresponds to the minimum gap, the stress relieving layer patterns 220 have the width W20 that corresponds to the minimum line width.

In the present embodiment, in the region where the space of the first intermediate patterns 240 has the width W10 or less that corresponds to the minimum gap W1, the overlapped second intermediate patterns 260 are left to thereby form the stress relieving layer patterns 220 having a width greater than the width corresponding to the minimum line width. By forming the stress relieving layer patterns 220 in this manner, the space of the stress relieving layer patterns 220 can be prevented from becoming smaller than the width W10 that corresponds to the minimum gap W1 in the used design rule.

Figure 20:
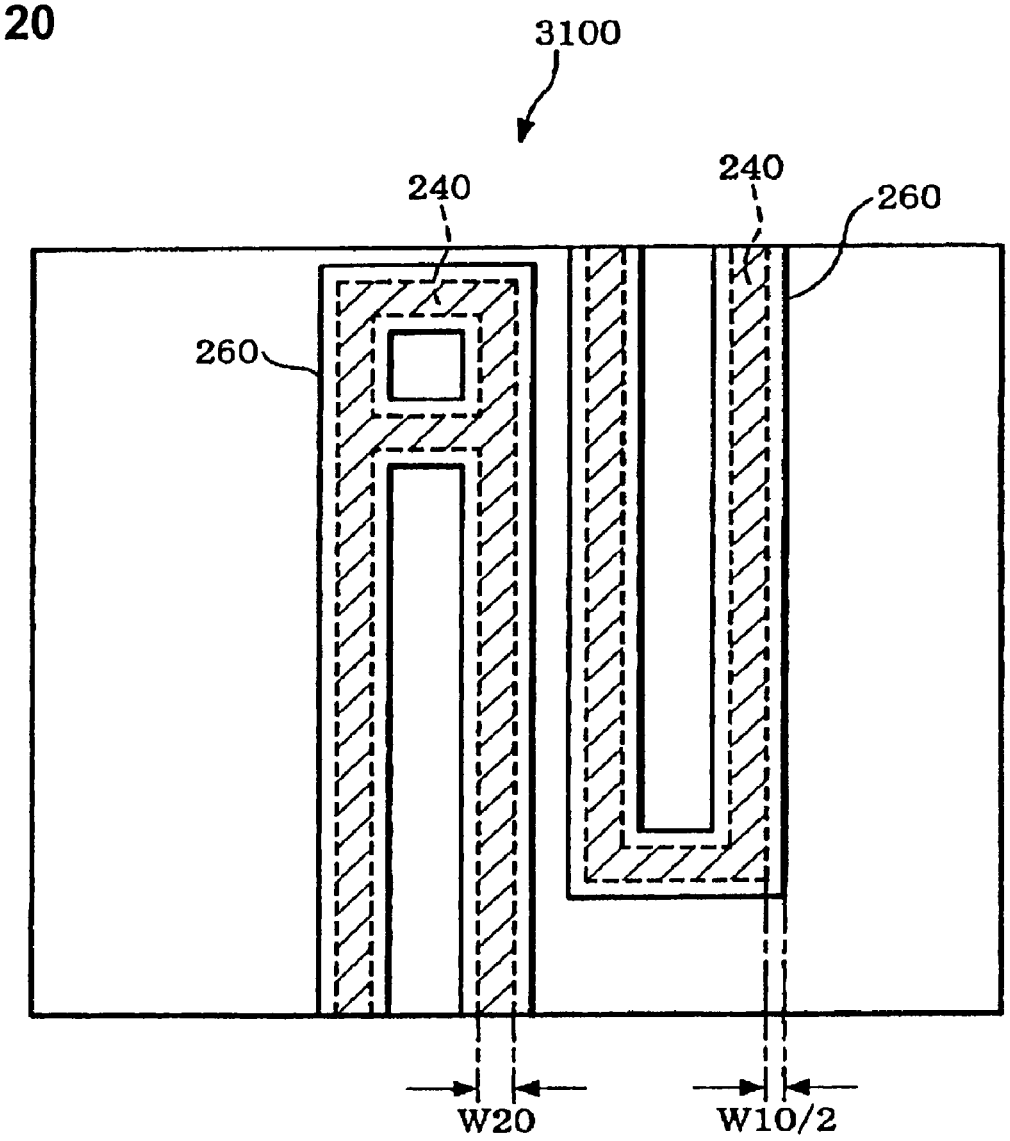
FIG. 20 shows another first intermediate mask data for generating the third mask data in accordance with the first embodiment of the present invention.
Figure 21:
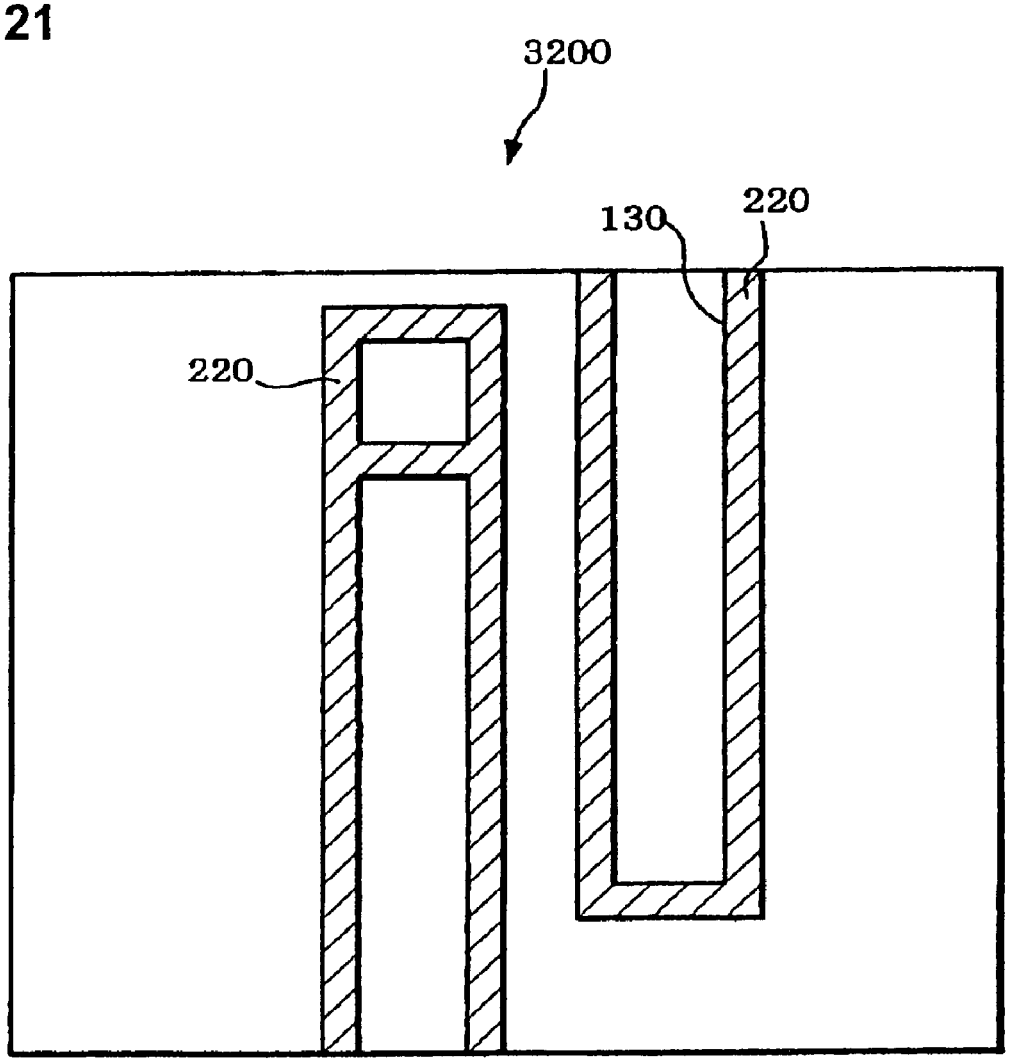
FIG. 21 shows another second intermediate mask data for generating the third mask data in accordance with the first embodiment of the present invention.

Also, in the region where the space of the first intermediate patterns 240 is greater than the width that corresponds to the minimum gap, the second intermediate patterns 260 do not overlap one another, and therefore the stress relieving layer patterns 220 having a width that corresponds to the minimum line width. For example, in the example shown in FIG. 20 and FIG. 21, since the space of the first intermediate patterns 240 is greater than the width W10 that corresponds to the minimum gap W1 in the used design rule, the second intermediate patterns 260 do not overlap one another. Therefore, the stress relieving layer patterns 220 have the width W20 that corresponds to the minimum line width. It is noted that, in FIG. 20 and FIG. 21, portions that are substantially the same as those portions shown in FIG. 1 and FIG. 10 are indicated with the same reference numbers, and their detailed description is omitted.

(3) Creation of Fourth—Sixth Mask Data (Mask Data For Dummy Generation Region)

Figure 11:
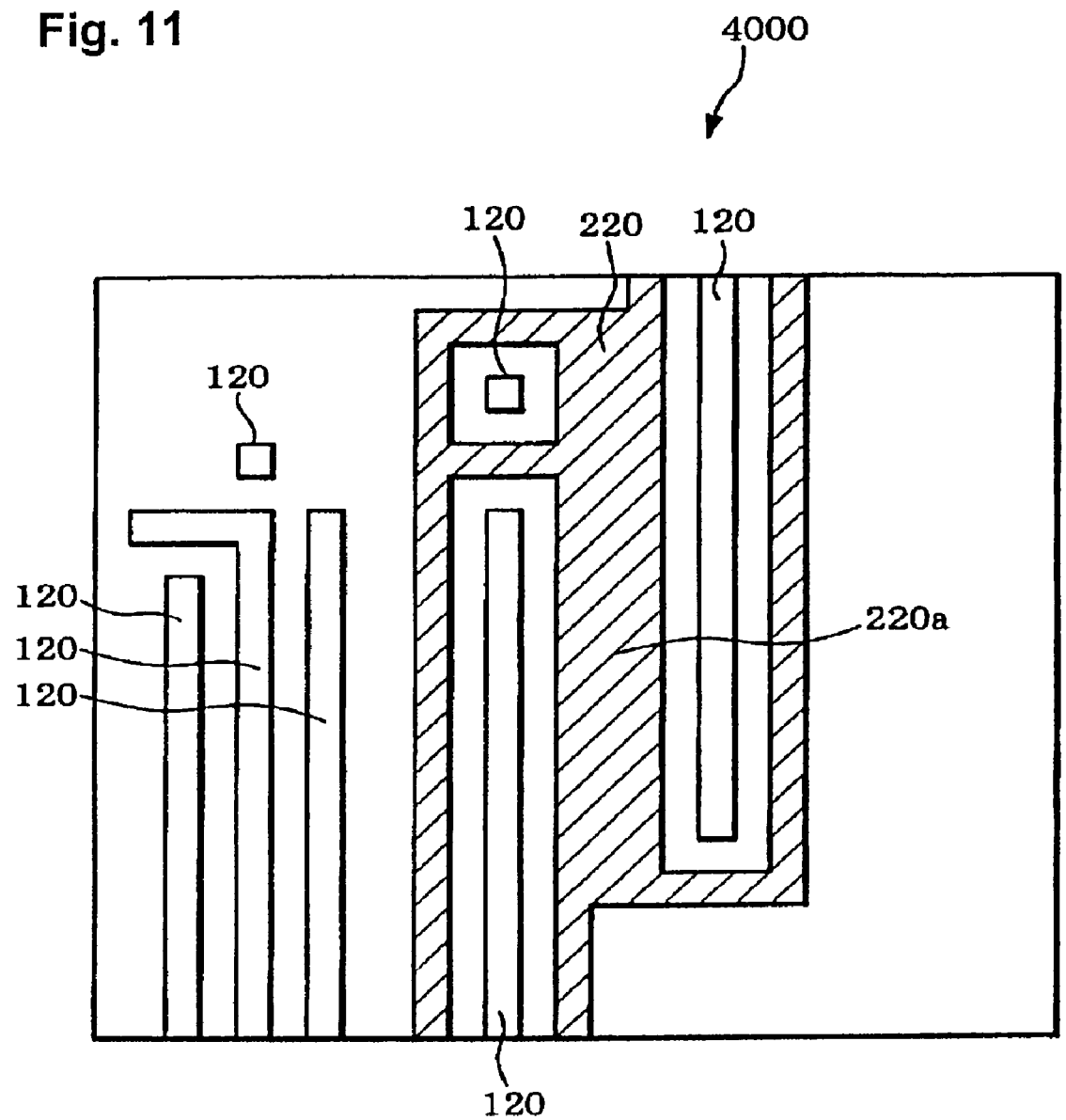
FIG. 11 shows fourth mask data in accordance with the first embodiment of the present invention.
Figure 12:
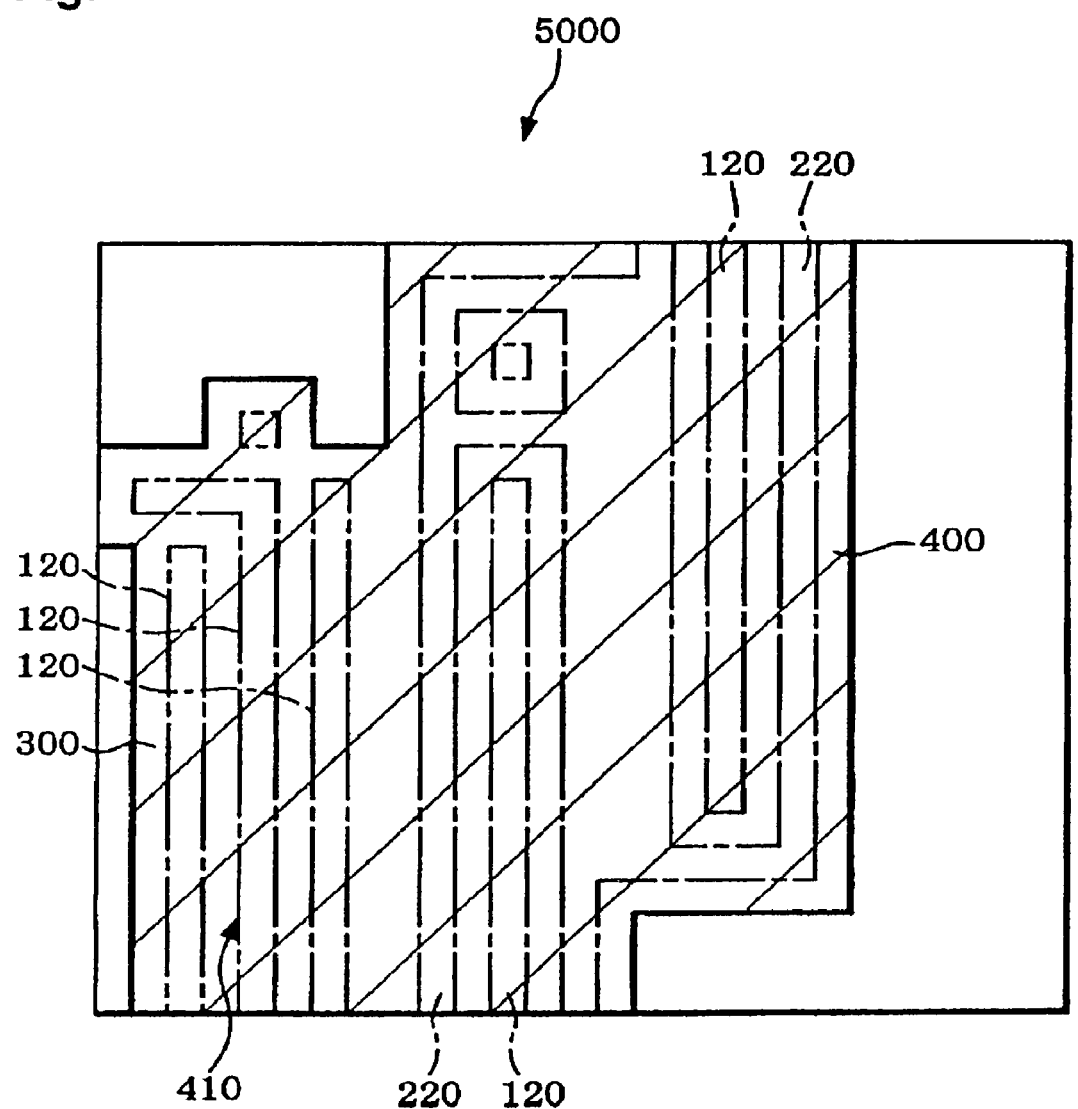
FIG. 12 shows fifth mask data in accordance with the first embodiment of the present invention.

The mask data for the wiring layer patterns and the third mask data 3200 in which the stress relieving layer patterns are set are mixed, to create fourth mask data 4000 shown in FIG. 11. Then, as shown in FIG. 12, a prohibit region pattern 400 that prohibits generation of dummy patterns is added around the wiring layer patterns 120 and the stress relieving layer patterns 220 in the fourth mask data 4000, whereby fifth mask data 5000 is created. More specifically, in the fifth mask data 5000, a dummy restricting region 410 indicated with cross-hatching defines a region where dummy patterns corresponding to dummy layers 30 are not generated.

Figure 13:
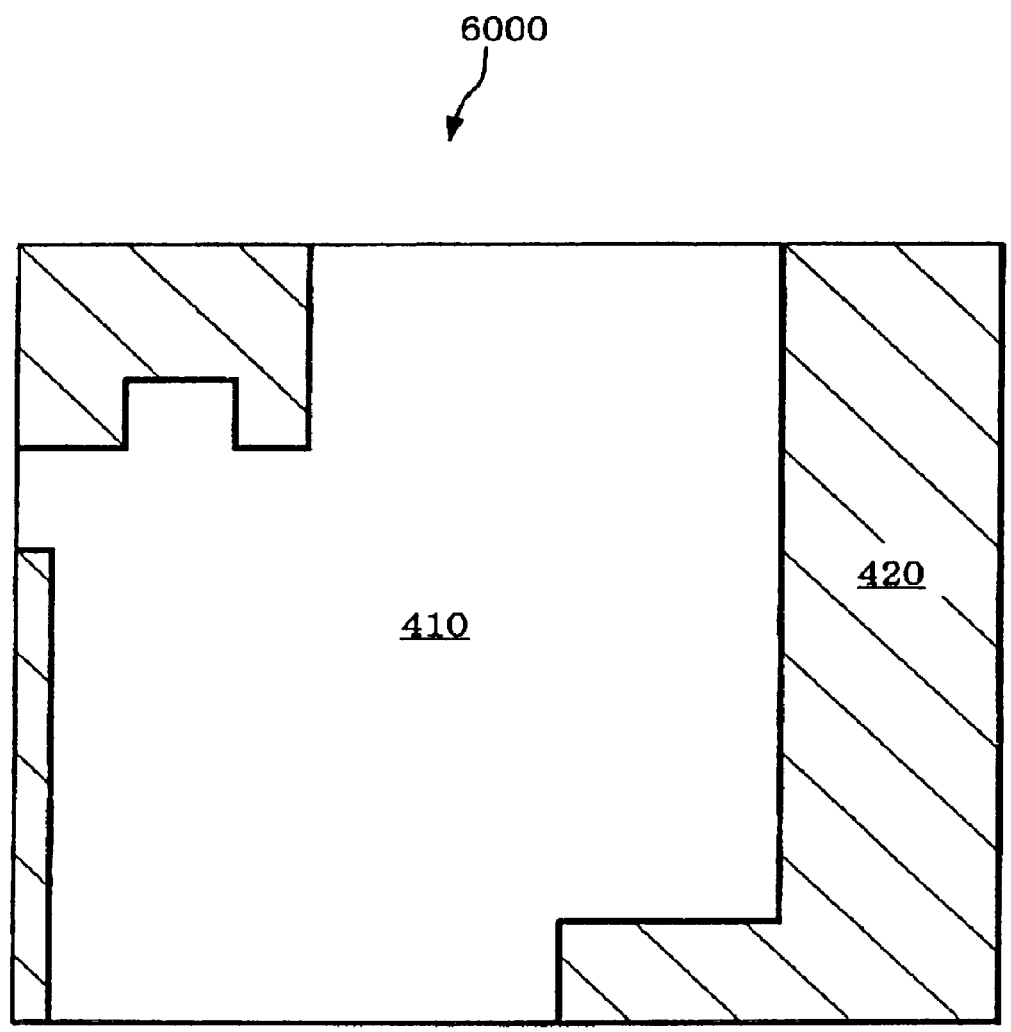
FIG. 13 shows sixth mask data in accordance with the first embodiment of the present invention.

Next, the fifth mask data 5000 is diagrammatically reversed, to form sixth mask data 6000 shown in FIG. 13. In other words, in the sixth mask data 6000, a blank area indicates the dummy restricting region 410 where dummy patterns are not generated, and a cross-hatched area indicates the dummy generation region 420 where dummy patterns are generated.

(4) Creation Of Seventh And Eighth Mask Data (Mask Data For Dummy Patterns)

Figure 14:
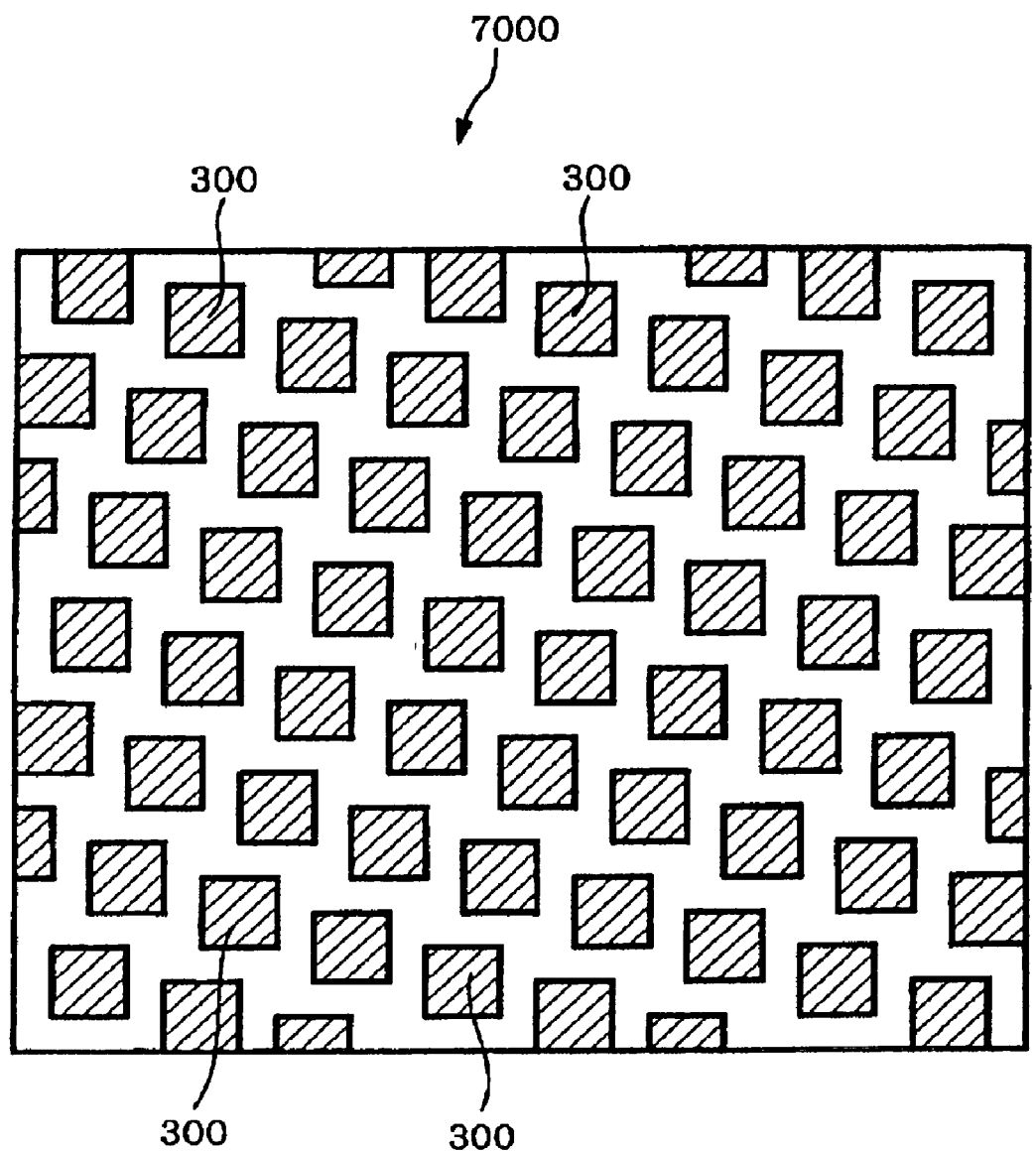
FIG. 14 shows seventh mask data in accordance with the first embodiment of the present invention.

FIG. 14 shows seventh mask data 7000 in which dummy patterns 300 corresponding to the dummy layers 30 are set. In the mask data 7000, in the illustrated example, the dummy patterns 300 having rectangular planes are closely arranged in the entire area.

Figure 15:
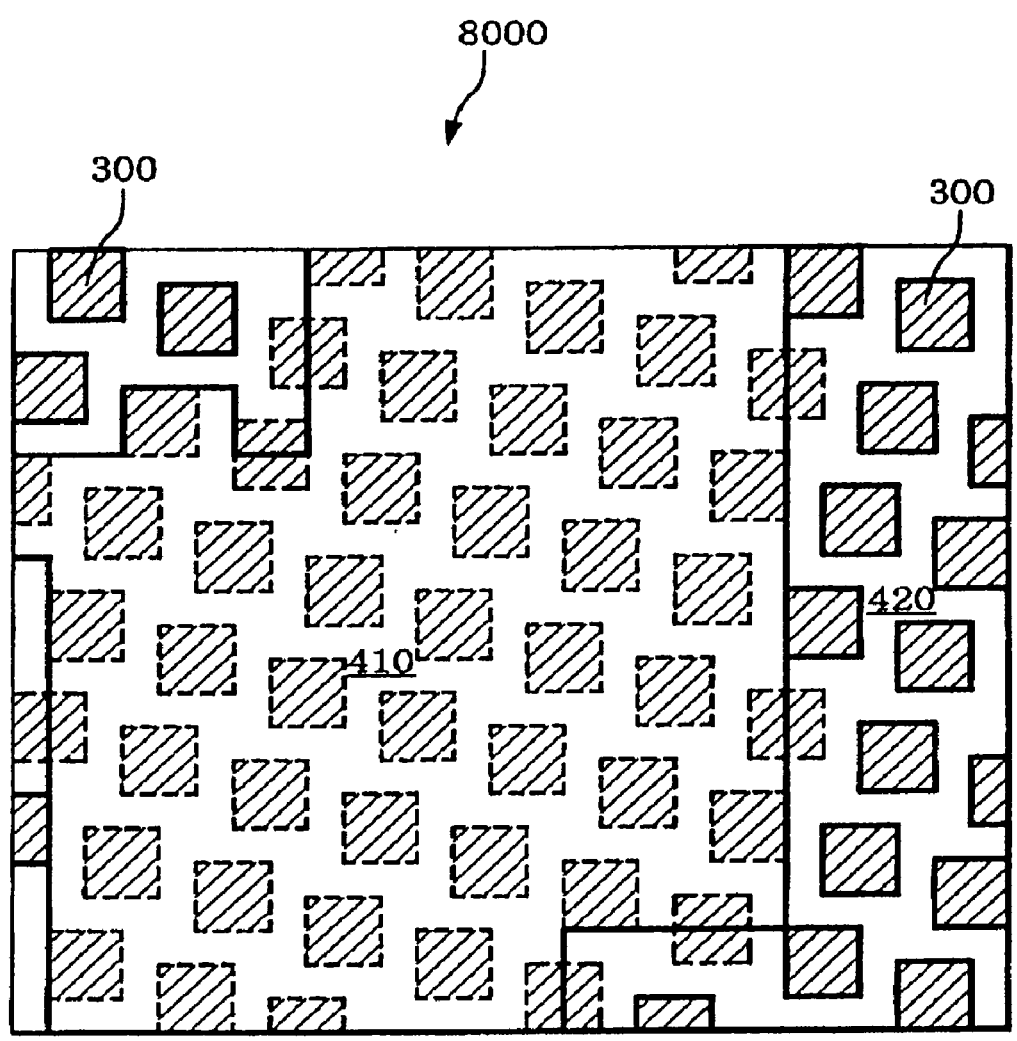
FIG. 15 shows eighth mask data in accordance with the first embodiment of the present invention.

The sixth mask pattern 6000 shown in FIG. 13 and the seventh mask pattern 7000 shown in FIG. 14 are mixed to create eighth mask data 8000 shown in FIG. 15. In the eighth mask data 8000, common parts of the dummy generation region 420 in the sixth mask data 6000 and the dummy patterns 300 of the seventh mask data 7000 are extracted. In other words, the dummy patterns 300 that overlap the dummy restricting region 410 in the sixth mask data 6000 are eliminated. Therefore, in the eighth mask data 8000, the dummy patterns 300 are generated only in the dummy generation region 420.

(5) Creation Of Ninth Mask Data (Mask Data For Stress Relieving Layer Patterns And Dummy Patterns)

Figure 16:
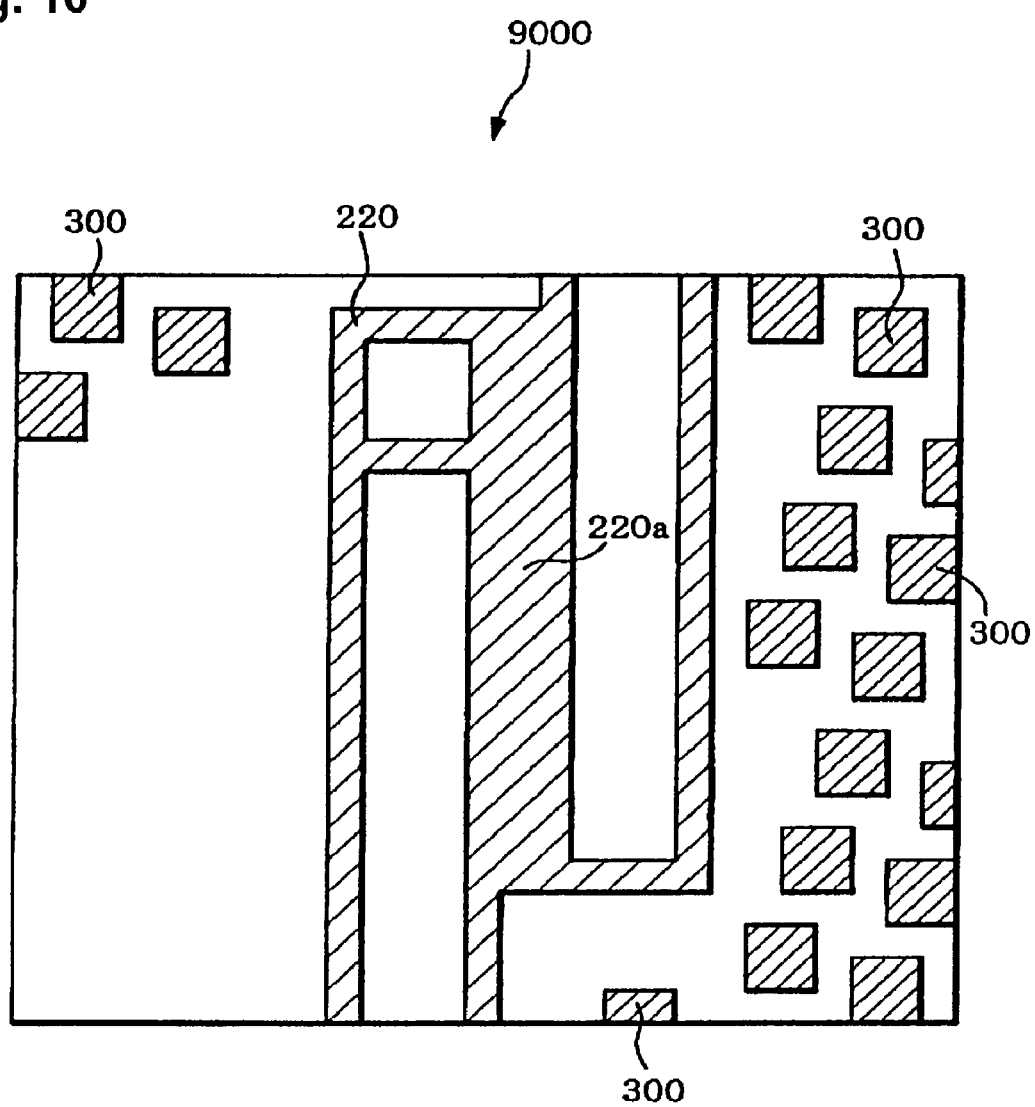
FIG. 16 shows ninth mask data in accordance with the first embodiment of the present invention.

Next, the third mask data 3200 shown in FIG. 10 and the eighth mask data 8000 shown in FIG. 15 are mixed, to create ninth mask data 9000 shown in FIG. 16. In the ninth mask data 9000, the stress relieving layer patterns 220 and the dummy patterns 300 are set. The ninth mask data 9000 is used for patterning the stress relieving layers 22 and the dummy layers 30 in a method for manufacturing semiconductor devices to be described later.

When the stress relieving layers 22 and the dummy layers 30 are formed by using the ninth mask data 9000, and a positive type resist is used, cross-hatched areas in the ninth mask data define shutter sections in the mask (for example, chrome patterns). When a negative type resist is used, areas other than the cross-hatched areas (blank areas) define shutter sections in the mask (for example, chrome patterns).

The ninth mask data 9000 thus obtained can be recorded on a computer readable recording medium if necessary. Also, masks for patterning the stress relieving layers 22 and the dummy layers 30 can be obtained based on the ninth mask data 9000.

The above embodiment describes a method for generating mask data that is used when the stress relieving layers 22 and the dummy layers 30 are formed in the same step. However, the present invention is not limited to this embodiment. For example, when the stress relieving layers 22 and the dummy layers 30 are formed in independent steps, the third mask data 3200 shown in FIG. 10 can be used for patterning the stress relieving layers 22. In this case, the dummy layers 30 can be formed, for example, in the same step in which the wiring layers 12 are formed.

The gaps and line widths of the stress relieving layers 22 are not limited to the minimum gap and the minimum line width described above, and may be in any of various sizes within the range permissible in terms of design.

[Manufacturing Method]

Figure 3:
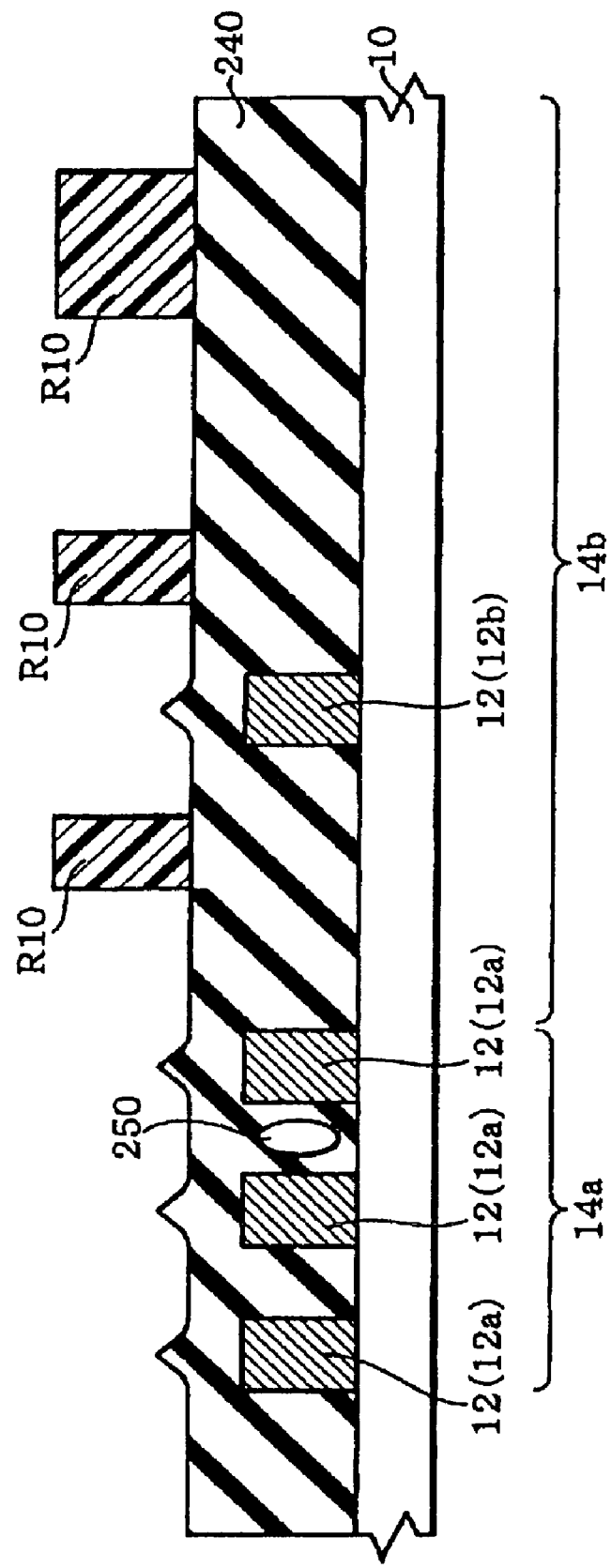
FIG. 3 schematically shows in cross section a step of the method for manufacturing a semiconductor device in accordance with the first embodiment of the present invention.
Figure 4:
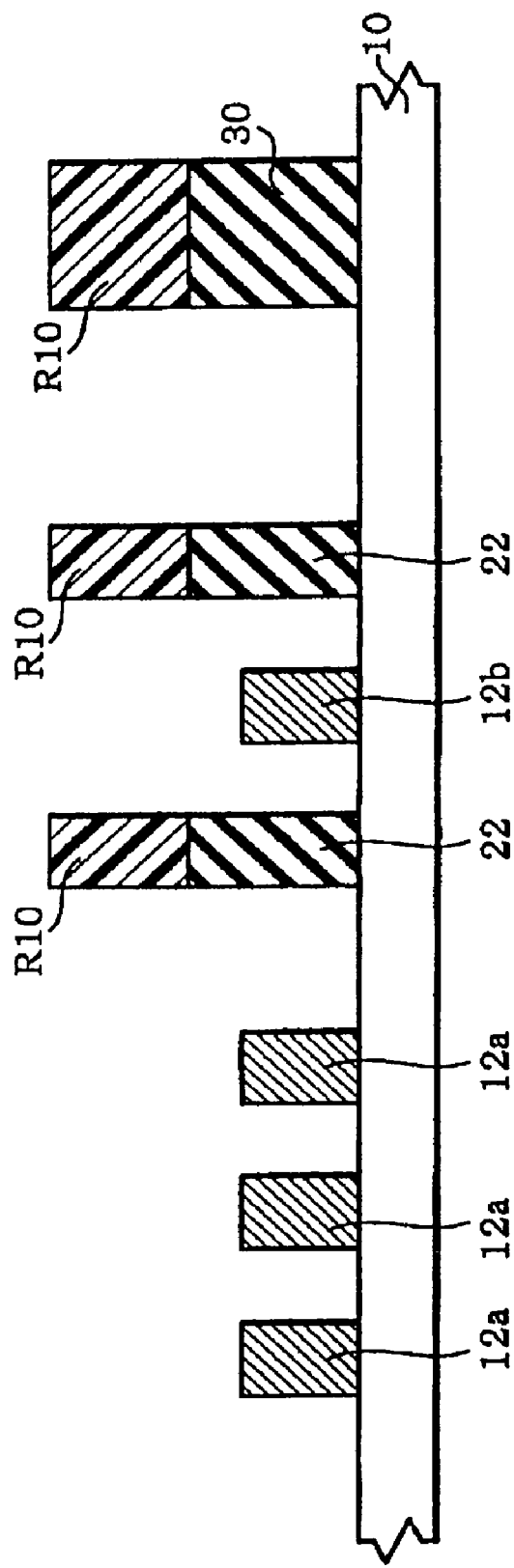
FIG. 4 schematically shows in cross section a step of the method for manufacturing a semiconductor device in accordance with the first embodiment of the present invention.
Figure 5:
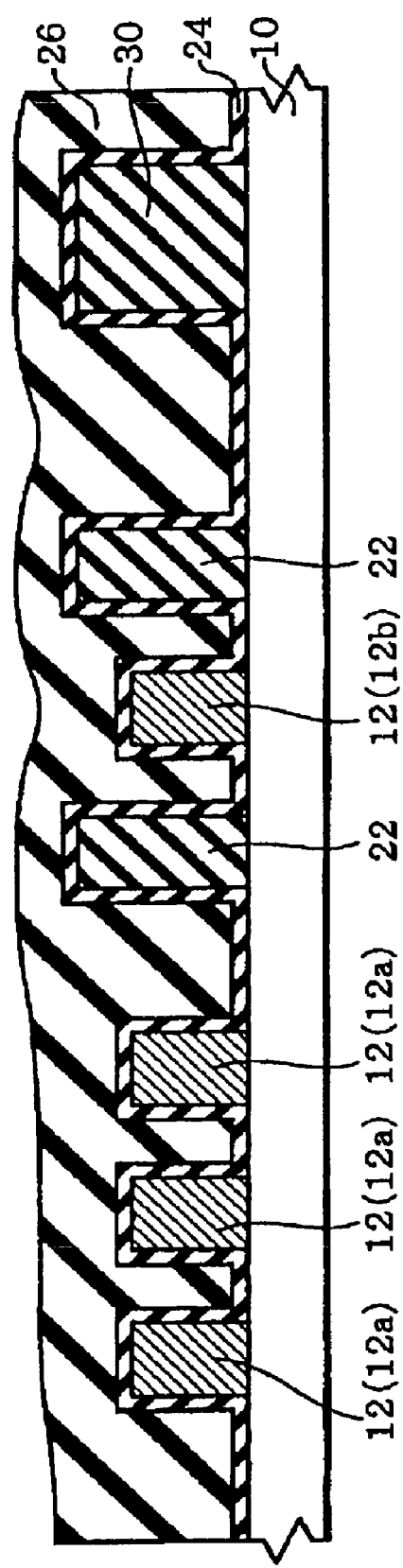
FIG. 5 schematically shows in cross section a step of the method for manufacturing a semiconductor device in accordance with the first embodiment of the present invention.

Next, one example of a method for manufacturing the semiconductor device 100 shown in FIGS. 1 and 2 will be described. FIGS. 3–5 schematically show in cross section steps of the manufacturing method.

(a) As shown in FIG. 3, a conductive layer composed of metal or the like is formed on a base 10, and then the conductive layer is patterned by generally practiced lithography and etching to form wiring layers 12. In the example shown in FIG. 1 and FIG. 2, the wiring layers 12 in a dense pattern region 14a are indicated with reference numerals "12a", and the wiring layers 12 in a rough pattern region 14b are indicated with reference numerals "12b". Metal that composes the conduction layer has been described above, and its description is not repeated.

Then, a silicon oxide layer 240 is formed over the entire surface of the base 10 by a CVD method. The silicon oxide layer 240 is formed in a manner to cover at least the wiring layers 12. For the CVD method, a normal pressure CVD, a plasma CVD, a high-density plasma CVD or the like described above can be used. Even when the silicon oxide layer 240 is formed by, for example, a high-density plasma CVD which generally provides an excellent embedding property, voids 250 are apt to be formed between the wiring layer 12a and the wiring layer 12a that are formed at minimum wiring layer gaps.

Then, a resist layer R10 for stress relieving layers 22 and dummy layers 30 is formed on the silicon oxide layer 240, using the mask obtained based on the ninth mask data 9000 in accordance with the present embodiment described above.

(b) Next, as shown in FIG. 4, the silicon oxide layer 240 shown in FIG. 3 is etched using the resist layer R10 as a mask, to form stress relieving layers 22. In this instance, the silicon oxide layers between the wiring layers 12a, 12a that are disposed at minimum gaps are also removed. As a result, the voids 250 shown in FIG. 3 are also eliminated.

Then, the resist layer R10 is removed by a known method such as ashing.

The patterns of the stress relieving dielectric layers 22 and the dummy layers 30 have already described above, and their description is not repeated.

(c) Next, as shown in FIG. 5, a base dielectric layer 24 is formed over the entire surface of the base 10 on which the wiring layers 12 (12a, 12b) and the stress relieving layers 22 are formed. Then, a planarization dielectric layer 26 composed of a liquid dielectric material is formed on the base dielectric layer 24. The planarization dielectric layer 26 is formed in a manner to cover at least the base dielectric layer 24, and fill gaps between the wiring layers 12, between the wiring layers 12 and the stress relieving layers 22 and between the stress relieving layers 22 and the dummy layers 30 with the dielectric layers. Film forming methods for the base dielectric layer 24 and the planarization dielectric layer 26 have already been described, and their description is not repeated.

(d) Then, as shown in FIG. 2, a cap dielectric layer 28 is formed over the entire surface of the planarization dielectric layer 26. The cap dielectric layer 28 has a thickness that sufficiently fills the surface roughness of the planarization dielectric layer 26, plus a thickness that is polished by a CMP process as necessary. The example shown in FIG. 2 indicates a state in which the top surface of the cap dielectric layer 28 has been planarized by a CMP process.

(Second Embodiment)

Figure 17:
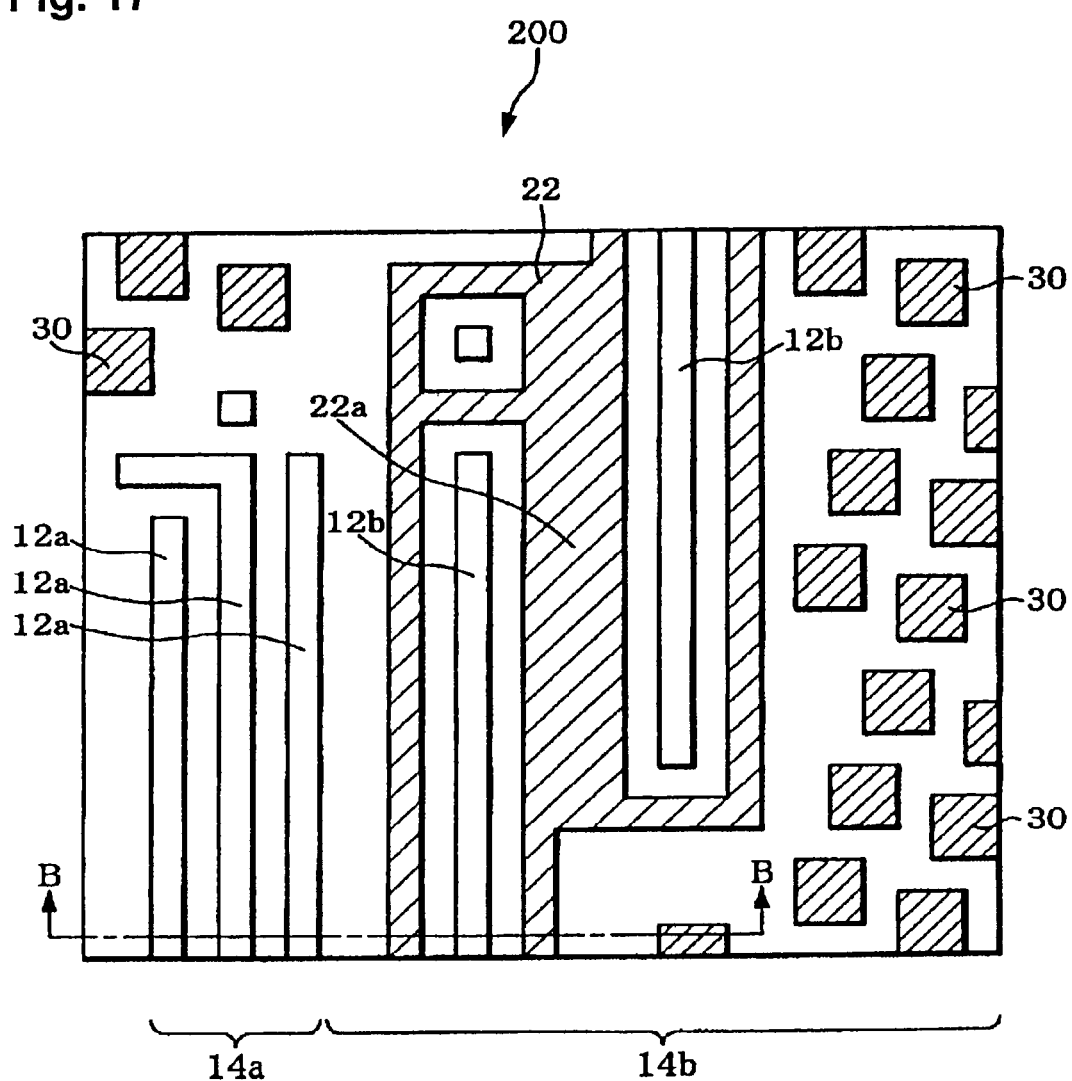
FIG. 17 schematically shows a plan view of a semiconductor device obtained by a method for manufacturing a semiconductor device in accordance with a second embodiment of the present invention.
Figure 18:
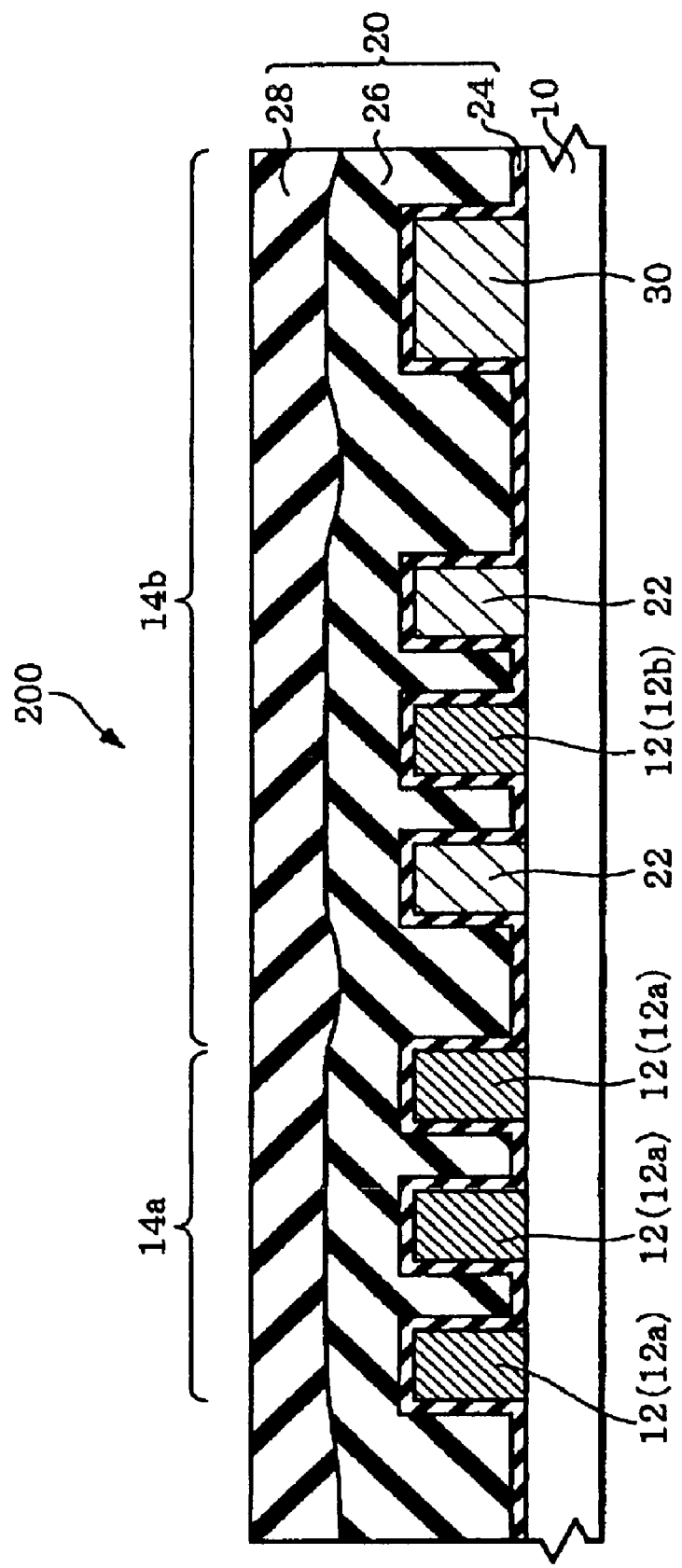
FIG. 18 shows a cross-sectional view of the semiconductor device taken along a line B—B shown in FIG. 17.

First, a description is made as to a semiconductor device that is manufactured by using masks obtained by a method for generating mask data in accordance with the present embodiment. FIG. 17 schematically shows a plan view in part of wiring layers of a semiconductor device 200, and FIG. 18 schematically shows a cross-sectional view taken along a line B—B of FIG. 17. This embodiment is different from the first embodiment in that stress relieving layers are formed in the same step in which wiring layers are formed. Members substantially the same as those used in the first embodiment are indicated with the same reference numbers, and their detailed description is omitted.

The semiconductor device 200 includes wiring layers 12 (12a, 12b), stress relieving layers 22, dummy layers 30, and an interlayer dielectric layer 20 that is formed in a manner to cover the wiring layers 12, stress relieving layers 22 and dummy layers 30, which are formed on a base 10.

The stress relieving layers 22 and the dummy layers 30 are patterned in the same step in which the wiring layers 12 are patterned, and formed from the same material as that of the wiring layers 12.

Figure 19:
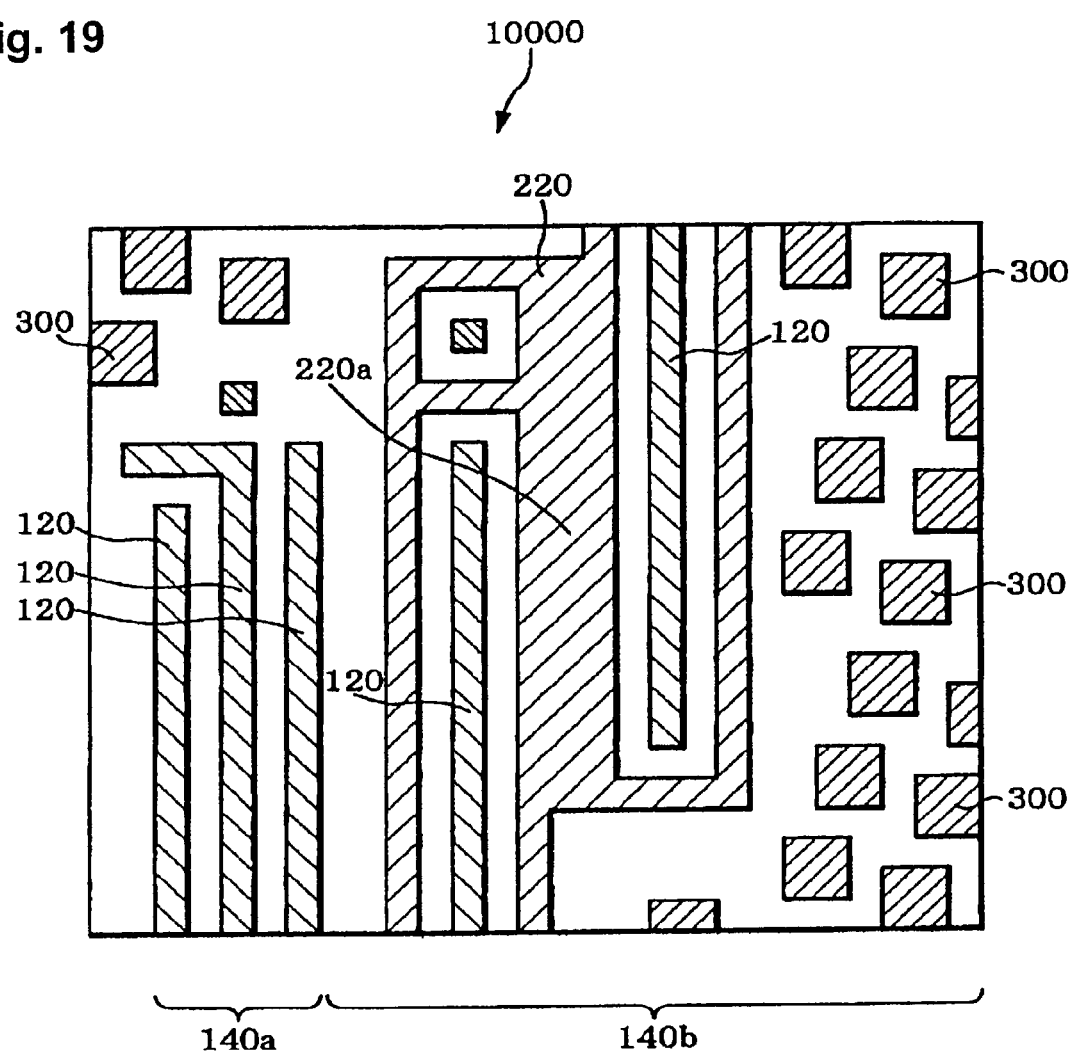
FIG. 19 shows mask data in accordance with the second embodiment of the present invention.

A mask for patterning the wiring layers 12, stress relieving layers 22 and dummy layers 30 is formed based on mask data 10000 shown in FIG. 19. The mask data 10000 can be created by adding the mask data for the wiring layer patterns 120 to the ninth mask data described in the first embodiment. In other words, it can be created by mixing the third mask data 3000 shown in FIG. 8, the eighth mask data 8000 shown in FIG. 13 and the mask data for the wiring layer patterns 120. In the mask data 10000, wiring layer patterns 120, stress relieving layer patterns 220 and dummy patterns 300 are set. The mask data 10000 is used for patterning the wiring layers 12, stress relieving layers 22 and dummy layers 30 in a method for manufacturing semiconductor devices to be described later.

Next, one example of a method for manufacturing the semiconductor device 200 shown in FIGS. 17 and 18 will be described.

(a) A conductive layer composed of metal or the like is formed on a base 10, and then a resist layer (not shown) for wiring layers 12, stress relieving layers 22 and dummy layers 30 is formed, using a mask obtained based on the mask data 10000 in accordance with the present embodiment. Then, the conductive layer is patterned by generally practiced lithography and etching to form wiring layers 12, stress relieving layers 22 and dummy layers 30. Metal that composes the conduction layer has been described above, and its description is not repeated.

(b) Then, as shown in FIG. 18, a base dielectric layer 24 is formed by a CVD method described above over the entire surface of the base 10 on which the wiring layers 12 (12*a*, 12*b*), stress relieving layers 22 and dummy layers 30 are formed.

(c) Then, as shown in FIG. 18, a planarization dielectric layer 26 composed of a liquid dielectric material is formed on the base dielectric layer 24. The planarization dielectric layer 26 is formed in a manner to cover at least the base dielectric layer 24, and fill gaps between the wiring layers 12, between the wiring layers 12 and the stress relieving layers 22 and between the stress relieving layers 22 and the dummy layers 30 with the dielectric layers.

(d) Then, as shown in FIG. 18, a cap dielectric layer 28 is formed over the entire surface of the planarization dielectric layer 26. The cap dielectric layer 28 has a thickness that sufficiently fills the surface roughness of the planarization dielectric layer 26, plus a thickness that is polished by a CMP process as necessary. The example shown in FIG. 18 indicates a state in which the top surface of the cap dielectric layer 28 has been planarized by a CMP process.

An interlayer dielectric layer 20 is composed of the base dielectric layer 24, the planarization dielectric layer 26 and the cap dielectric layer 28 that are formed in the above-described steps (b), (c) and (d).

The embodiments of the present invention have been described above, but the present invention is not limited to these embodiments, and can assume a variety of modified embodiments within the scope of the subject matter of the present invention. The entire disclosure of Japanese Patent Application No. 2001-272233 filed Sep. 7, 2001 is incorporated by reference.

What is claimed is:

1. A method comprising:
   using a computer to generate mask data, the generation of mask data accomplished according to the steps of:
   forming resized patterns, the resized patterns formed by modifying specified wiring layer patterns by enlarging the specified wiring layer patterns by a positive (+) resizing amount;
   deleting, among the resized patterns, the resized patterns that have portions that mutually overlap one another; and
   forming stress relieving layer patterns that have a specified width outside the resized patterns.

2. The method according to claim 1, wherein, in the step of forming the resized patterns, the resizing amount corresponds to a minimum gap between the wiring layers in a given design rule.

3. The method according to claim 1, wherein the stress relieving layer patterns have a width that corresponds to a minimum line width of the wiring layers in a given design rule.

4. The method according to claim 3, wherein the stress relieving layer patterns further include a portion having a greater width than a width corresponding to the minimum line width of the wiring layers in the given design rule.

5. The method according to claim 4, wherein the step of forming stress relieving layer patterns comprises:
   a step of forming, outside the resized patterns, first intermediate patterns having a width corresponding to the minimum line width in the used design rule;
   a step of forming second intermediate patterns by positively resizing the first intermediate patterns with a resizing amount having a width corresponding to ½ of the minimum gap of the wiring layers in the used design rule;
   a step of negatively resizing the second intermediate patterns with a resizing amount having a width corresponding to ½ of the minimum gap of the wiring layers in the used design rule; and
   a step of designating mutually overlapping portions among the second intermediate patterns as one pattern.

6. The method according to claim 1, wherein the stress relieving layer patterns are continuous along the wiring layer patterns.

7. The method according to claim 1, wherein the stress relieving layer patterns are disposed at least in a region that corresponds to a rough pattern region of the wiring layers.

8. The method according to claim 1, wherein data for a dummy generation region is added to the data for the stress relieving layer patterns.

9. The method according to claim 8, further comprising adding data for wiring layer patterns.

10. A mask manufactured by utilizing mask data generated by the method as recited in claim 1.

11. A computer readable recording medium capable of recording mask data generated by the method for generating mask data recited in claim 1.

12. A method for manufacturing a semiconductor device including wiring layers disposed on a base and an interlayer dielectric layer that covers the wiring layers, the method comprising:
   a step of forming at least stress relieving layers in a specified pattern on the base, using the mask recited in claim 10;
   a step of forming a planarization dielectric layer from a liquid dielectric material in a manner to cover the stress relieving layers and the wiring layers.

13. The method for manufacturing a semiconductor device according to claim 12, wherein the step of forming the planarization dielectric layer is conducted by a coating method.

14. The method for manufacturing a semiconductor device according to claim 12, wherein the step of forming the planarization dielectric layer is conducted by a liquid CVD method.

15. The method for manufacturing a semiconductor device according to claim 10, wherein the step of forming the planarization dielectric layer includes the steps of depositing a dielectric layer by a CVD method to cover the wiring layers over the base, and then patterning the dielectric layer.

16. The method for manufacturing a semiconductor device according claim 15, wherein the stress relieving layers and dummy layers are patterned at the same time.

17. The method for manufacturing a semiconductor device according to claim 10, wherein the step of forming the stress relieving layers includes the step of patterning the stress relieving layers and the wiring layers at the same time.

18. The method for manufacturing a semiconductor device according claim 17, wherein dummy layers are further patterned at the same time as the stress relieving layers and the wiring layers.

19. The method for manufacturing a semiconductor device according to claim 10, wherein the step of forming the interlayer dielectric layer further includes the step of forming a base dielectric layer at least on the wiring layers and the stress relieving layers, and the step of forming a cap dielectric layer on the planarization dielectric layer.

20. A method comprising:

a step of generating mask data using a computer, the step comprising:

defining a wiring layer pattern on a base;

defining an initial resized wiring layer pattern by expanding the wiring layer pattern by a given amount;

deleting overlapping portions of the initial resized wiring layer pattern to form a final resized wiring layer pattern; and defining a stress relieving layer pattern by specifying a given width outboard of the final resized wiring layer pattern.

* * * * *